(12) United States Patent
Miyashita et al.

(10) Patent No.: US 11,991,877 B2
(45) Date of Patent: May 21, 2024

(54) DRAM CIRCUITRY AND METHOD OF FORMING DRAM CIRCUITRY

(71) Applicant: Micron Technology, Inc., Boise, ID (US)

(72) Inventors: Toshihiko Miyashita, Boise, ID (US); Dan Mocuta, Boise, ID (US)

(73) Assignee: Micron Technology, Inc., Boise, ID (US)

(*) Notice: Subject to any disclaimer, the term of this patent is extended or adjusted under 35 U.S.C. 154(b) by 223 days.

(21) Appl. No.: 17/388,184

(22) Filed: Jul. 29, 2021

(65) Prior Publication Data

US 2023/0031076 A1 Feb. 2, 2023

(51) Int. Cl.
*H10B 12/00* (2023.01)
*H01L 27/092* (2006.01)
*H01L 29/08* (2006.01)
*H01L 29/167* (2006.01)
*H01L 29/423* (2006.01)
(Continued)

(52) U.S. Cl.
CPC ......... *H10B 12/50* (2023.02); *H01L 27/0924* (2013.01); *H01L 29/0847* (2013.01); *H01L 29/167* (2013.01); *H01L 29/42368* (2013.01); *H01L 29/51* (2013.01);
(Continued)

(58) Field of Classification Search
CPC ..... H10B 12/50; H10B 12/09; H01L 27/0924; H01L 29/0847; H01L 29/167; H01L 29/42368; H01L 29/51; H01L 29/66795; H01L 29/7851
See application file for complete search history.

(56) References Cited

U.S. PATENT DOCUMENTS 9,425,105 B1 * 8/2016 Basker ............ H01L 21/823821
2002/0122344 A1    9/2002 Takemura et al.
(Continued)

FOREIGN PATENT DOCUMENTS

TW    202103303    1/2021
WO    WO           10/2022
   PCT/US2022/034440

*Primary Examiner* — Karen Kusumakar
*Assistant Examiner* — Adam S Bowen
(74) *Attorney, Agent, or Firm* — Wells St. John P.S.

(57) ABSTRACT

DRAM circuitry comprises a memory array comprising memory cells individually comprising a transistor and a charge-storage device. The transistors individually comprise two source/drain regions having a gate there-between that is part of one of multiple wordlines of the memory array. One of the source/drain regions is electrically coupled to one of the charge-storage devices. The other of the source/drain regions is electrically coupled to one of multiple sense lines of the memory array. Peripheral circuitry comprises wordline-driver transistors having gates which individually comprise one of the wordlines and comprises sense-line-amplifier transistors having gates which individually comprise one of the sense lines. The sense-line-amplifier transistors and the wordline-driver transistors individually are a finFET having at least one fin comprising a channel region of the respective finFET. The sense-line-amplifier transistors and the wordline-driver transistors individually comprise two source/drain regions that individually comprise conductively-doped epitaxial semiconductor material that is adjacent one of two laterally-opposing sides of the at least one fin in a vertical cross-section. Methods are also disclosed.

17 Claims, 24 Drawing Sheets

(51) Int. Cl.
    *H01L 29/51*           (2006.01)
    *H01L 29/66*           (2006.01)
    *H01L 29/78*           (2006.01)

(52) U.S. Cl.
    CPC .... *H01L 29/66795* (2013.01); *H01L 29/7851* (2013.01); *H10B 12/09* (2023.02)

(56) References Cited

U.S. PATENT DOCUMENTS

| | | |
|---|---|---|
| 2015/0333075 A1 | 11/2015 | Yang et al. |
| 2017/0133275 A1 | 5/2017 | Kim et al. |
| 2019/0067303 A1* | 2/2019 | Juengling ............. H10B 51/30 |
| 2019/0198640 A1 | 6/2019 | Kerber et al. |
| 2019/0259840 A1 | 8/2019 | Kim et al. |
| 2021/0012828 A1 | 1/2021 | Kim et al. |
| 2021/0391385 A1* | 12/2021 | Kim .................. H01L 29/78696 |

\* cited by examiner

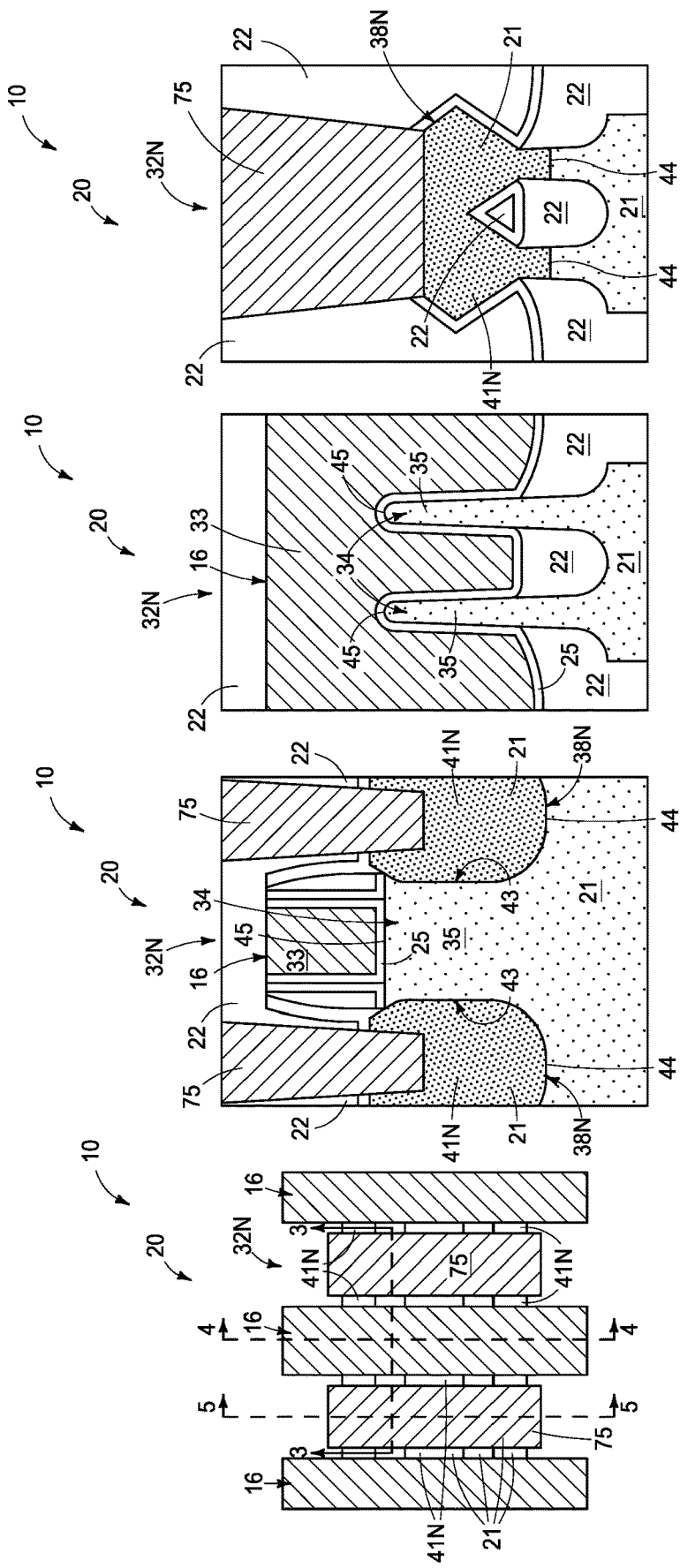

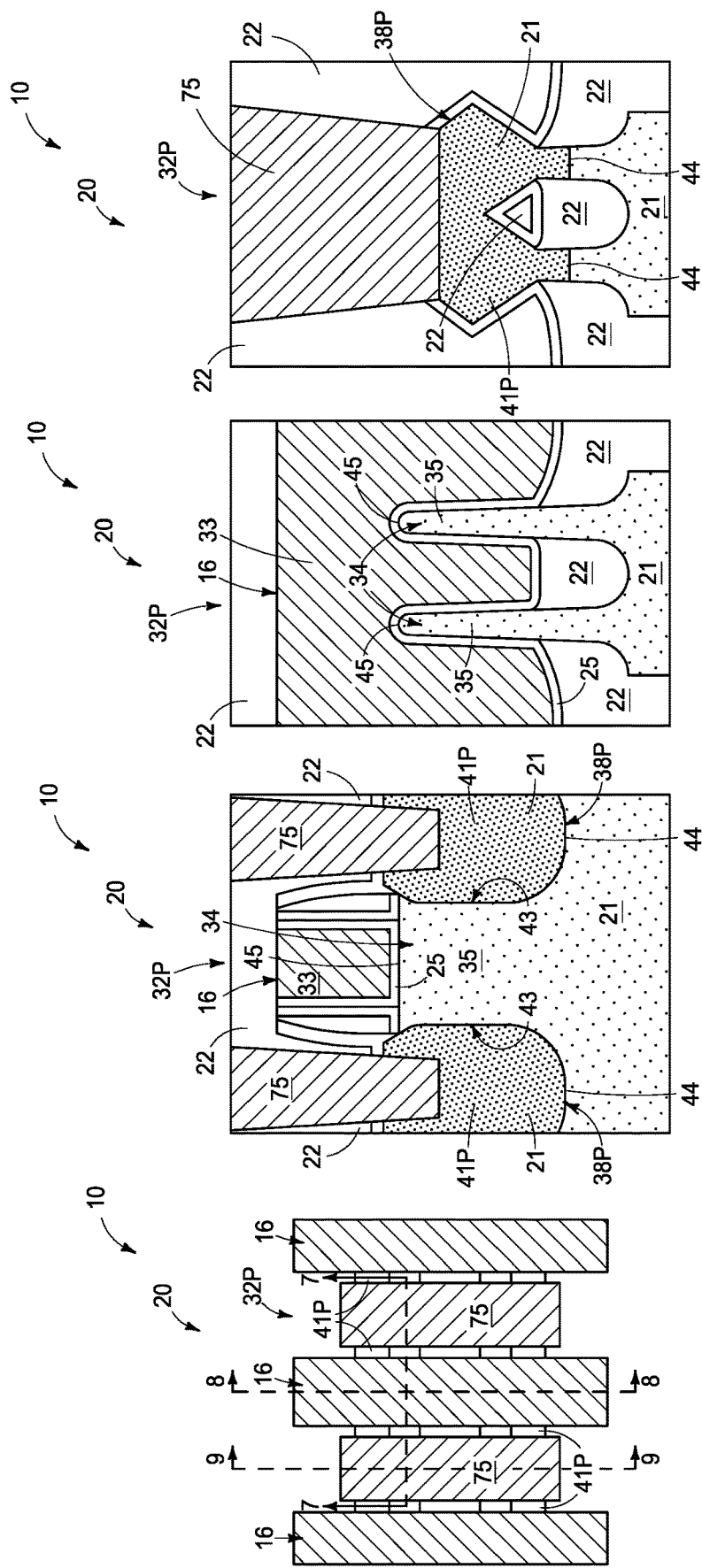

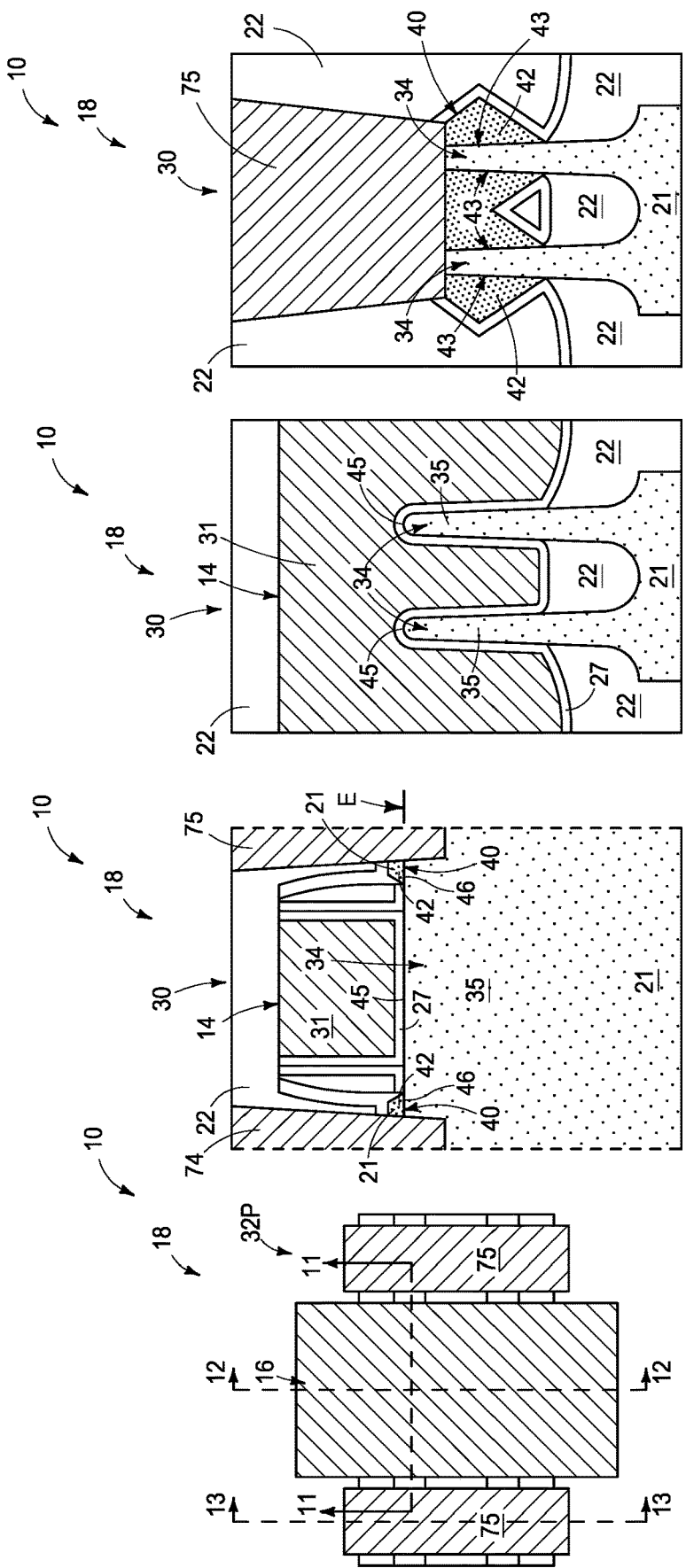

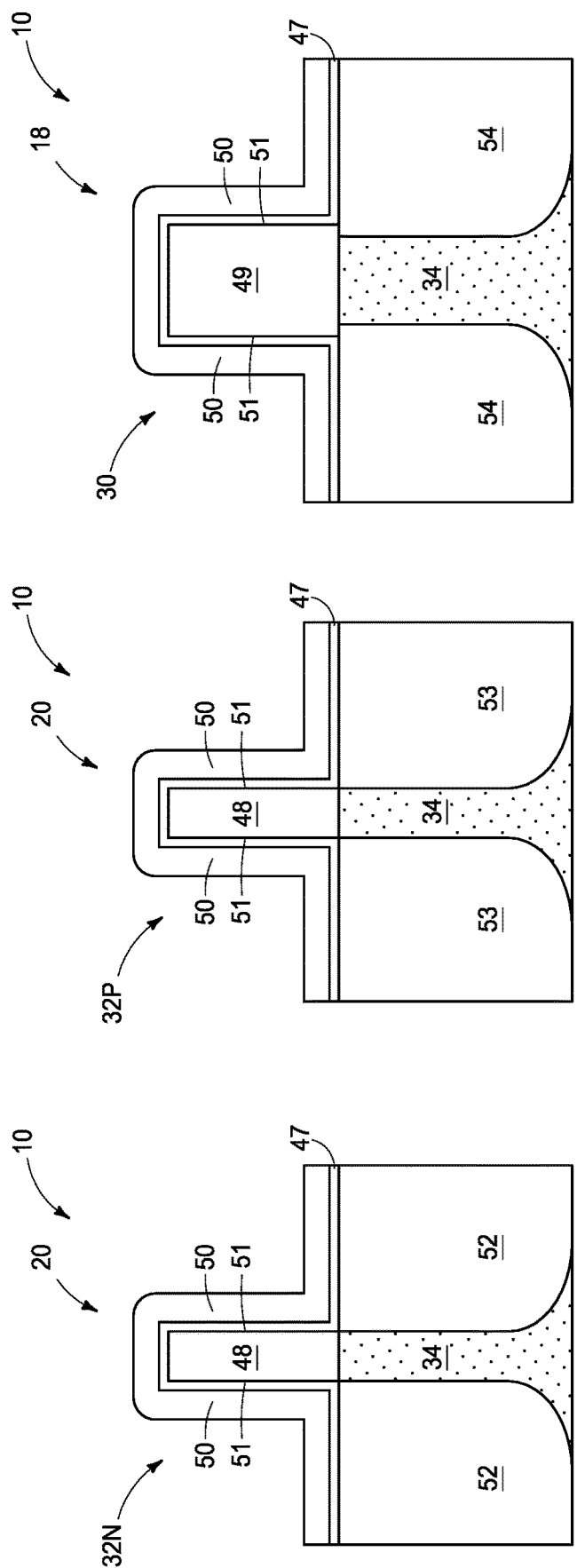

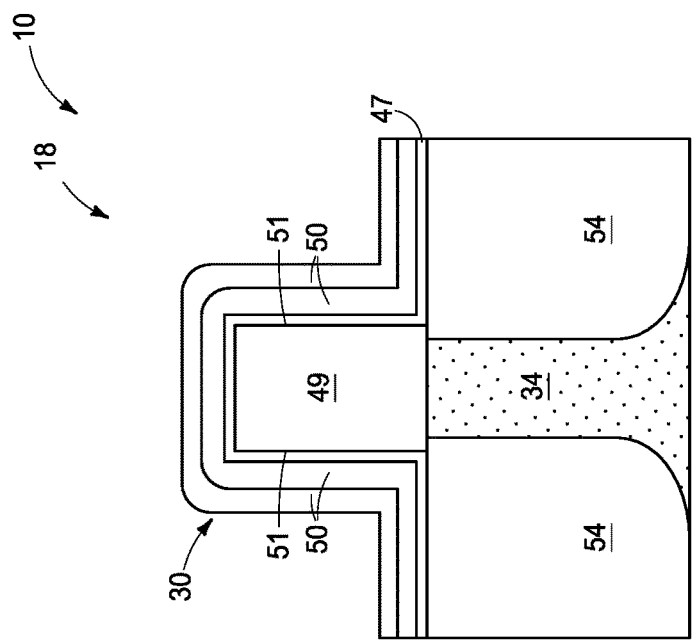
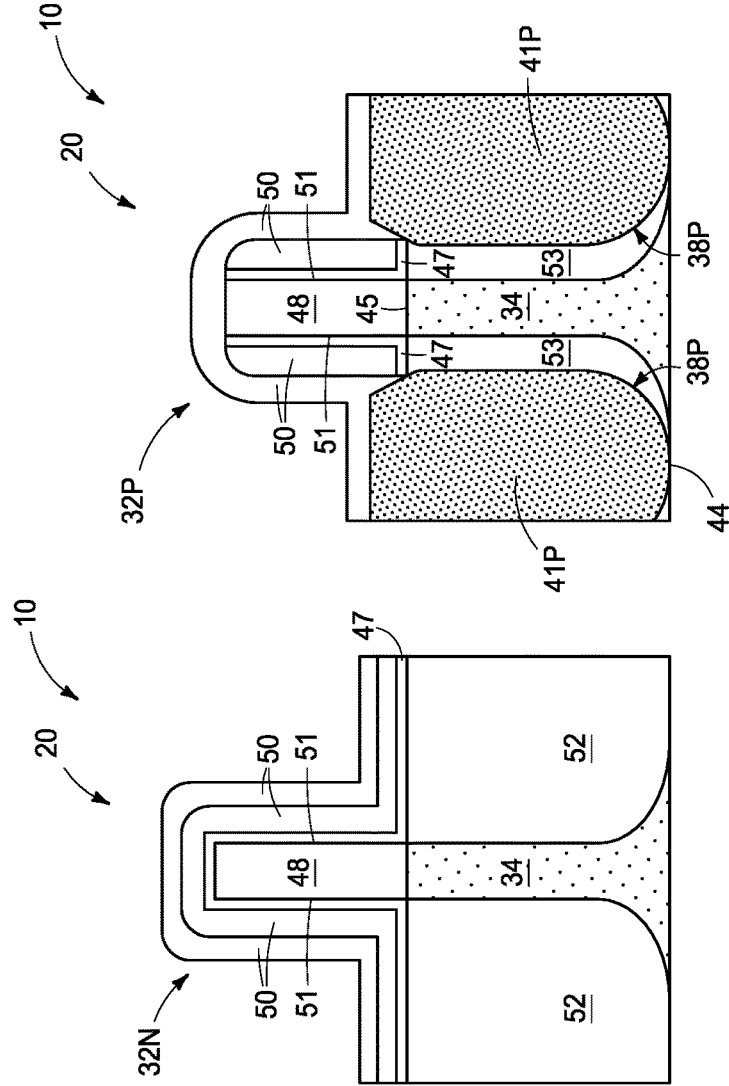

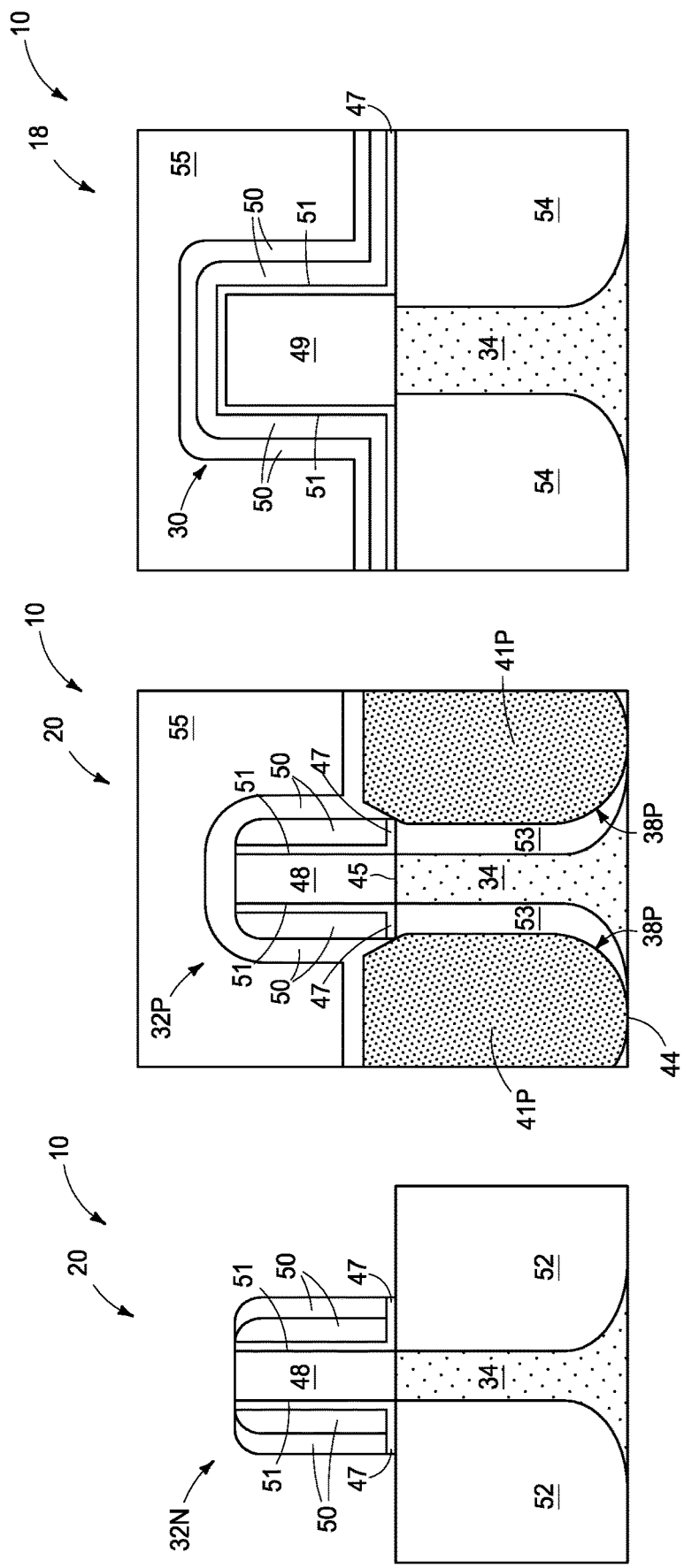

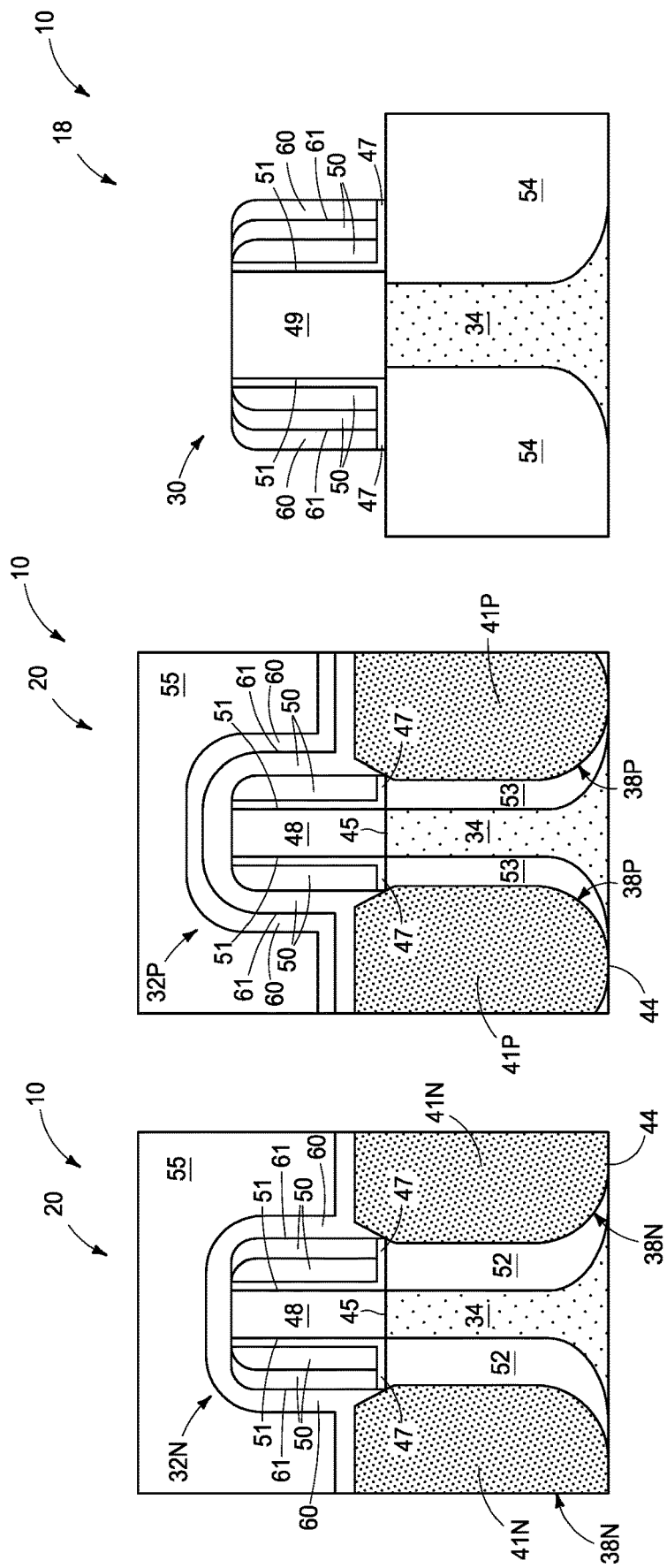

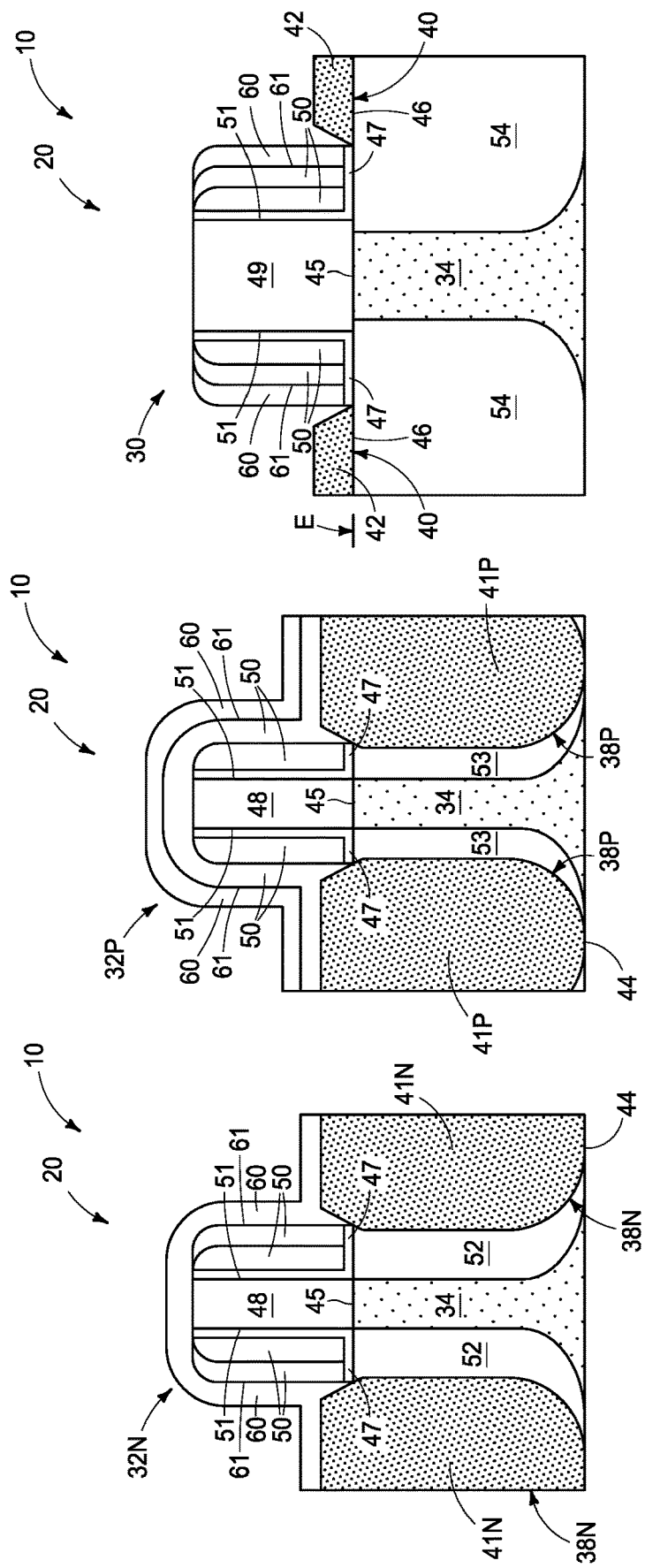

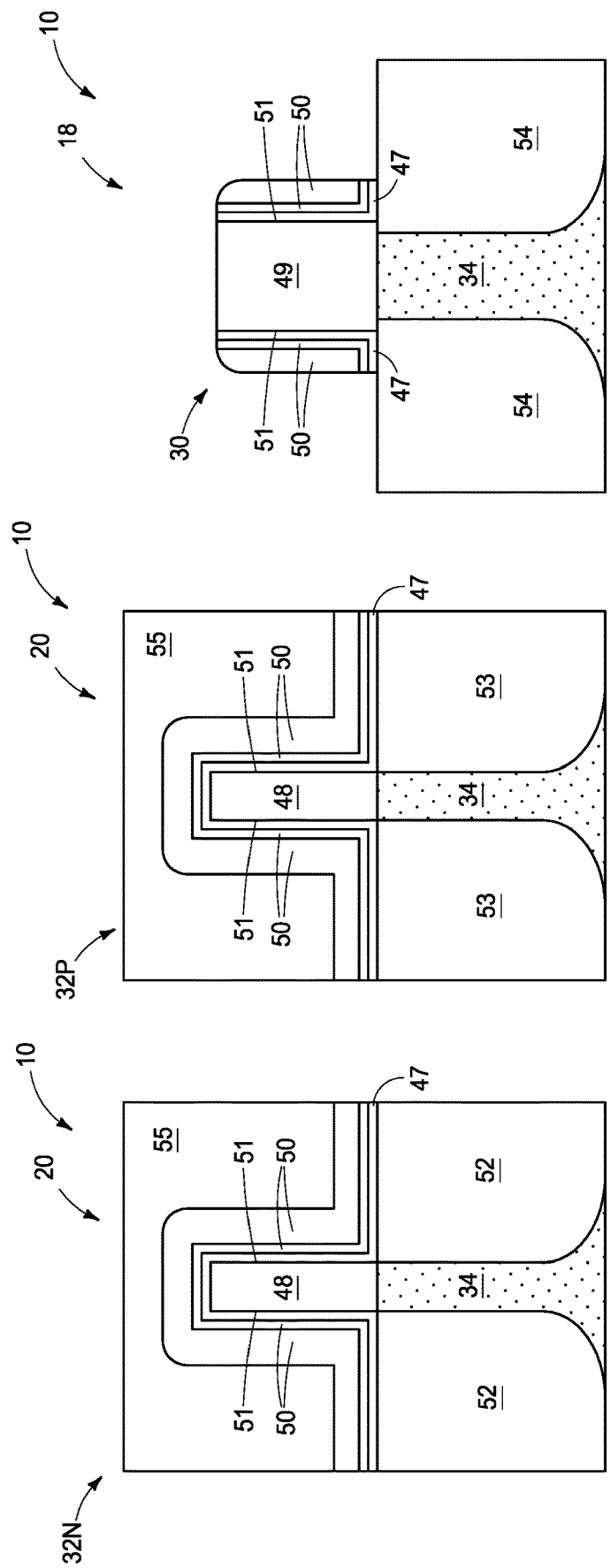

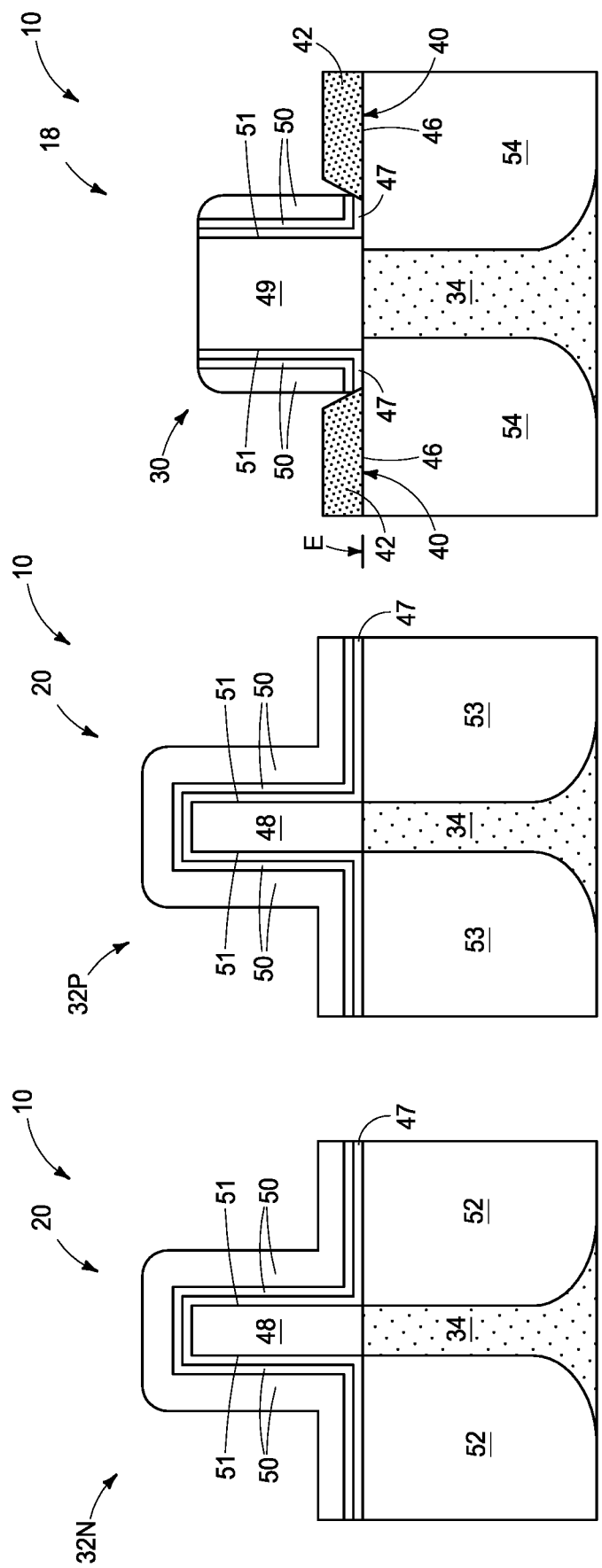

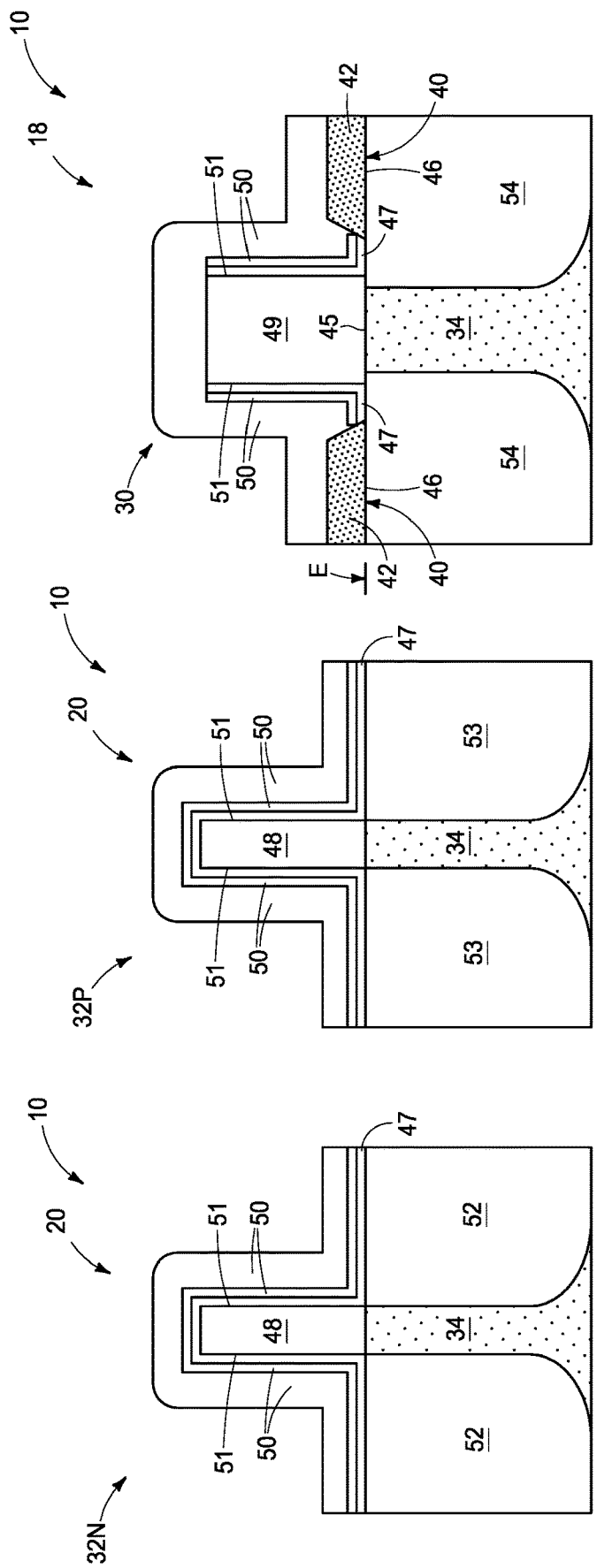

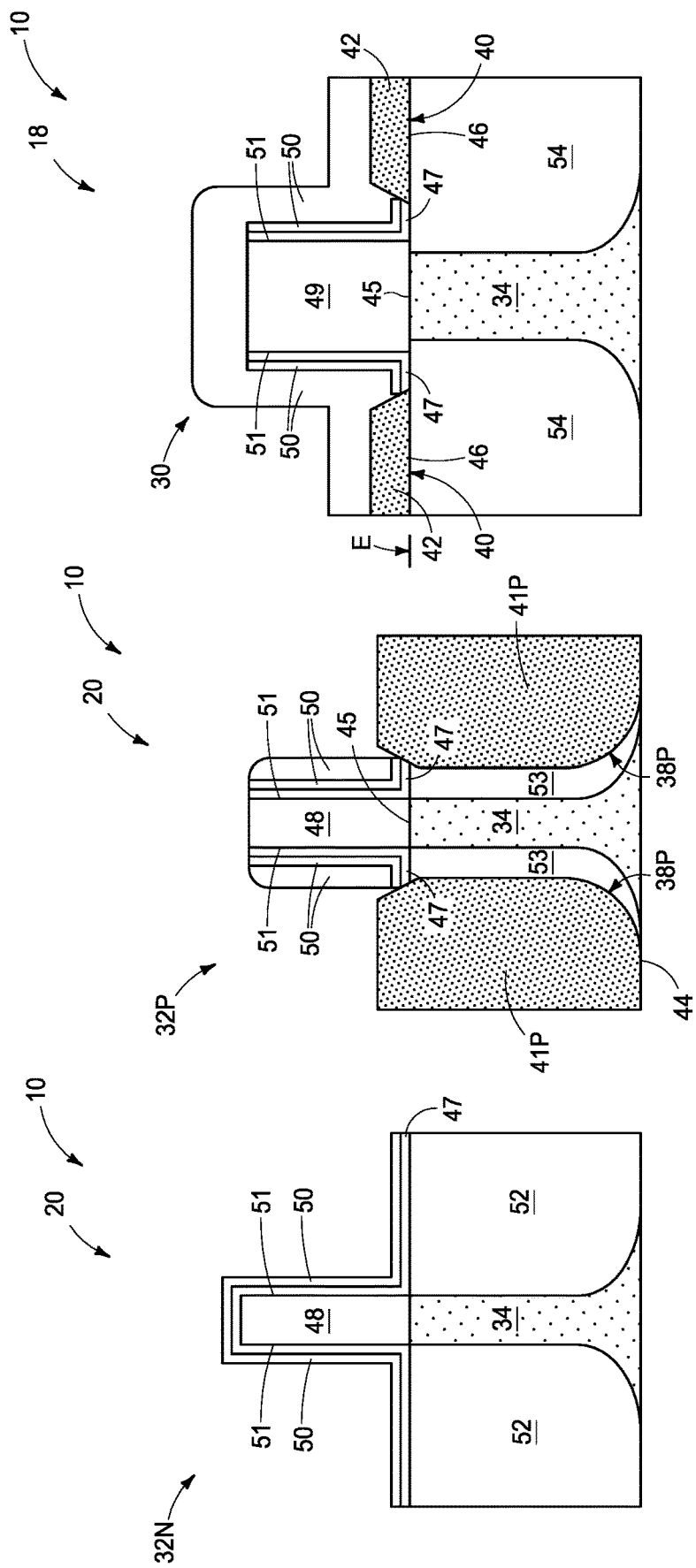

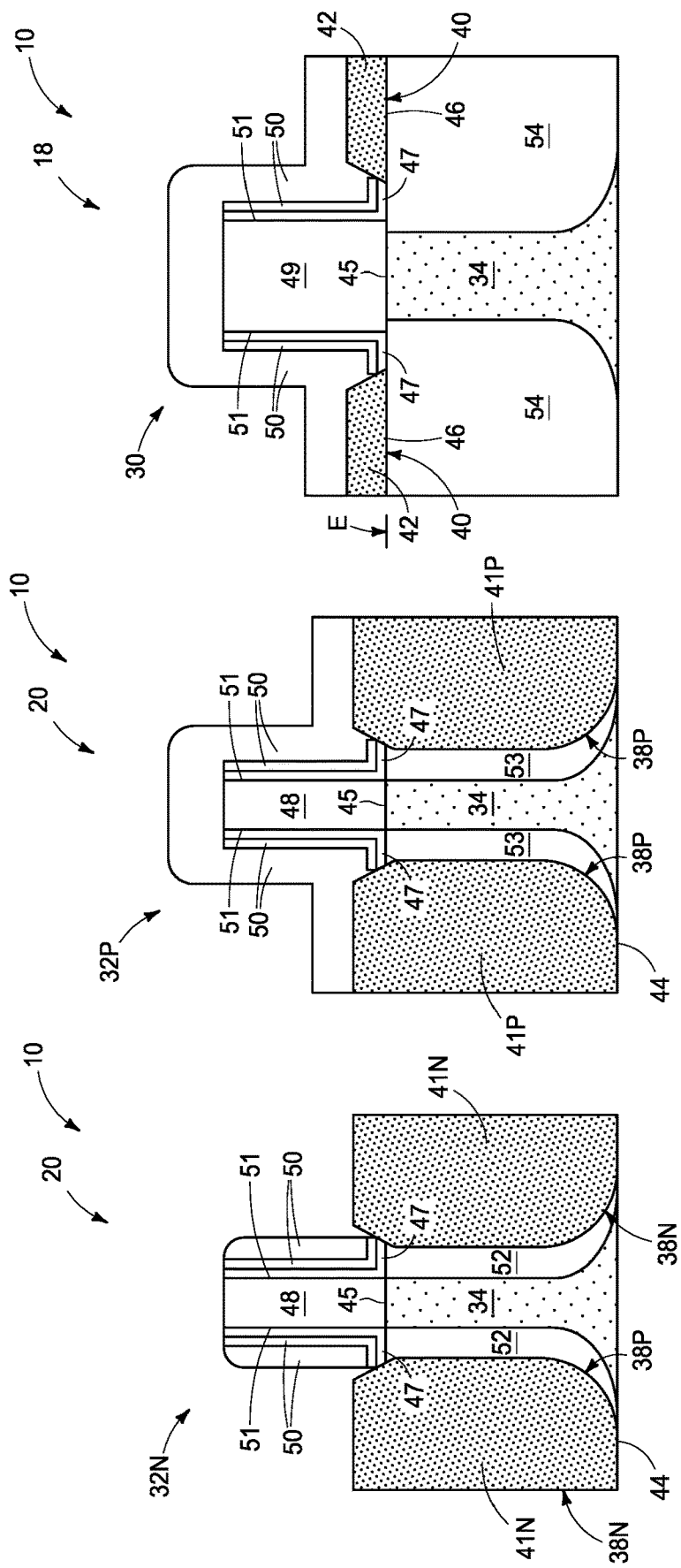

DRAM CIRCUITRY AND METHOD OF FORMING DRAM CIRCUITRY

TECHNICAL FIELD

Embodiments disclosed herein pertain to DRAM circuitry and to methods of forming DRAM circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

BRIEF DESCRIPTION OF THE DRAWINGS

FIGS. 2-13 are diagrammatic sectional views of portions of DRAM circuitry in accordance with an embodiment of the invention.

FIGS. 14-73 are diagrammatic section view of constructions in accordance with some method aspects of the invention in the forming of DRAM circuitry in accordance with some embodiments of the invention.

DETAILED DESCRIPTION OF EXAMPLE EMBODIMENTS

An embodiment of DRAM Circuitry in accordance with the invention is described initially with respect to FIGS. 1-13.

Figure 1:
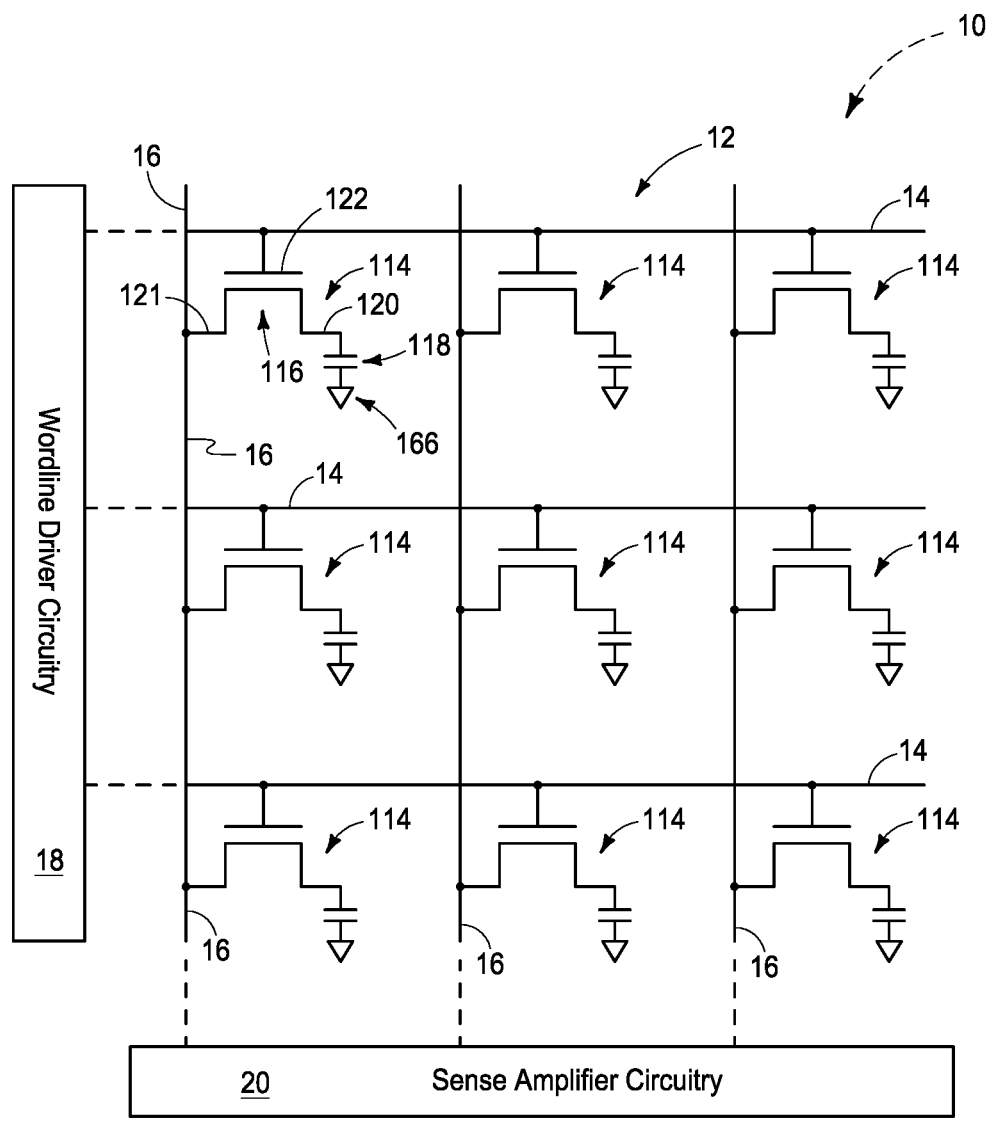
FIG. 1 is a diagrammatic schematic and structural view of DRAM circuitry in accordance with an embodiment of the invention.

FIG. 1 diagrammatically and schematically illustrates a portion of dynamic random access memory (DRAM) circuitry 10 comprising a memory array 12 comprising memory cells 114 individually comprising a transistor 116 and a charge-storage device 118 (e.g., a capacitor). Transistors 116 individually comprise two source/drain regions 120, 121 having a gate 122 there-between that is part of one of multiple wordlines 14 of memory array 12. One of the source/drain regions (e.g., 120) is electrically coupled (e.g., directly electrically coupled) to one of charge-storage devices 118. The other of the source/drain regions (e.g., 121) is electrically coupled to one of multiple sense lines 16 of memory array 12. Example charge-storage devices 118 as a capacitor has one of its nodes directly electrically coupled to source/drain region 120 of a transistor 116 and another node directly electrically coupled to a cell plate 166. Example cell plate 166 may be at any suitable reference voltage, including by way of example, 0V, a power supply voltage $V_{CC}$, one half of $V_{CC}$, or the like, depending upon application. DRAM circuitry 10 comprises peripheral circuitry comprising, for example, wordline-driver circuitry 18 and sense-line-amplifier circuitry 20. Wordlines 14 extend from memory array 12 to wordline-driver circuitry 18 and sense lines 16 extend from memory array 12 to sense-line-amplifier circuitry 20. By way of example, the peripheral circuitry may be wholly laterally aside memory array 12. Such may be partially laterally aside memory array 12 and/or wholly or partially above or below memory array 12. Regardless, additional peripheral circuitry may be provided (not shown). Wordlines 14 and sense lines 16 individually comprise one or more conductive materials (e.g., metal material) and that may not be the same relative one another.

Referring to FIGS. 2-13, wordline-driver circuitry 18 (FIGS. 10-13) comprises wordline-driver transistors 30 having gates 31 which individually comprise one of wordlines 14. Sense-line-amplifier circuitry 20 (FIGS. 2-9) comprises sense-line-amplifier transistors 32* (an * being used as a suffix to be inclusive of all such same-numerically-designated components that may or may not have other suffixes) having gates 33 which individually comprise one of sense lines 16. Sense-line-amplifier transistors 32* and wordline-driver transistors 30 individually are a finFET (e.g., 30 or 32*) having at least one fin 34 (multiple fins 34 [e.g., two] per individual transistor 30, 32* being shown) comprising a channel region 35 of the respective finFET (e.g., channel region 35 being appropriately doped semiconductive material [e.g., silicon, germanium, etc.] and comprising part of active area 21 having insulator material 22 there-between [e.g., silicon dioxide and/or silicon nitride]). Sense-line-amplifier transistors 32* and wordline-driver transistors 30 individually comprise two source/drain regions **38*/38* and 40/40, respectively, that individually comprise conductively-doped epitaxial semiconductor material 41* and 42, respectively, that is adjacent one of two laterally-opposing sides 43 (FIGS. 3, 7, 13) of at least one fin 34 in a vertical cross-section (e.g., that of each of FIGS. 3 and 7 for source/drain regions 38*/38* and that of FIG. 13 for source/drain regions 40/40**).

In one embodiment, sense-line-amplifier transistors 32* collectively comprise NMOS transistors 32N (FIGS. 2-5) and PMOS transistors 32P (FIGS. 6-9) (only one of each being shown for brevity). In one embodiment, source/drain regions 38N of sense-line-amplifier transistors 32N that comprise conductively-doped epitaxial semiconductor material 41N of NMOS transistors 32N individually comprise silicon that is conductively-doped with phosphorus. In one embodiment, source/drain regions 38P of sense-line-amplifier transistors 32P that comprise conductively-doped epitaxial semiconductor material 41P of PMOS transistors 32P individually comprise a mixture of silicon and germanium that is conductively-doped with boron. Wordline-driver transistors 30 also collectively may be n-type and p-type, for example, individually being one of PMOS or NMOS. Ideally, conductivity-imparting dopant concentration in conductively-doped epitaxial semiconductor material 41* and 42 is at least $1 \times 10^{20}$ atoms/cm$^3$ (e.g., and no greater than $1 \times 10^{22}$ atoms/cm$^3$). Additional conductivity-modifying impurity material may be in and/or adjacent conductively-doped epitaxial semiconductor material 41* and/or 42 (e.g., LDD and/or halo regions and not shown).

In one embodiment, conductively-doped epitaxial semiconductor material 41* of source/drain regions 38* of sense-line-amplifier transistors 32* has a bottom-most surface 44 that is lower than an uppermost surface 45 of the at least one fin 34. In one embodiment, conductively-doped epitaxial semiconductor material 42 of source/drain regions 40 of wordline-driver transistors 30 has a lower surface 46 that is at the same elevation (e.g., E) as uppermost surface 45 of the at least one fin 34.

In one embodiment, gate insulator 25 that is between the at least one fin 34 and gates 33 of sense-line-amplifier transistors 32* is thinner (i.e., physically or as equivalent oxide thickness [EOT]) than gate insulator 27 that is between the at least one fin 34 and gates 31 of wordline-driver transistors 30. In one embodiment, gate insulator 25 and gate insulator 27 are of the same composition relative one another, and in one such embodiment such same composition is silicon dioxide. In one embodiment, gate insulator 25 has thickness of 5 Angstroms to 30 Angstroms (i.e., physically or EOT) and gate insulator 27 has a thickness of 30 Angstroms to 60 Angstroms (i.e., physically or EOT).

Example conductive vias 75 are shown individually directly electrically coupling to source/drain regions 38*, 40.

Embodiments of the invention encompass methods used in forming DRAM circuitry. Embodiments of the invention encompass DRAM circuitry independent of method of manufacture. Nevertheless, such DRAM circuitry may have any of the attributes as described herein in method embodiments. Likewise, the described method embodiments may incorporate, form, and/or have any of the attributes described with respect to device embodiments.

A method of forming DRAM circuitry in accordance with one embodiment comprises forming a memory array (e.g., 12) comprising memory cells (e.g., 114) individually comprising a transistor (e.g., 116) and a charge-storage device (e.g., 118). The transistors individually comprise two source/drain regions (e.g., 120, 121) having a gate (e.g., 122) there-between that is part of one of multiple wordlines (e.g., 14) of the memory array. One of the source/drain regions (e.g., 120) is electrically coupled to one of the charge-storage devices. The other of the source/drain regions (e.g., 121) is electrically coupled to one of multiple sense lines (e.g., 16) of the memory array. Peripheral circuitry (e.g., 18) is formed that comprises wordline-driver transistors (e.g., 30) having gates (e.g., 31) which individually comprise one of the wordlines and comprising sense-line-amplifier transistors (e.g., 32*) having gates (e.g., 31) which individually comprise one of the sense lines. The sense-line-amplifier transistors and the wordline-driver transistors are formed individually to be a finFET having at least one fin (e.g., 34) comprising a channel region (e.g., 35) of the respective finFET. In one embodiment, the forming of the at least one fin 34 of the sense-line-amplifier transistors and the wordline-driver transistors occurs at the same time. The sense-line-amplifier transistors and the wordline-driver transistors are formed to individually comprise two source/drain regions (e.g., **38*/38*, 40/40) that individually comprise conductively-doped epitaxial semiconductor material (e.g., 41*, 42) that is adjacent one of two laterally-opposing sides (e.g., 43) of the at least one fin in a vertical cross-section (e.g., that of each of FIGS. 3 and 7 for source/drain regions 38*/38* and that of FIG. 13 for source/drain regions 40/40**).

In one embodiment, the forming of the conductively-doped epitaxial semiconductor material of the sense-line-amplifier transistors occurs before the forming of the conductively-doped epitaxial semiconductor material of the wordline-driver transistors (e.g., as shown in FIGS. 15-49). In another embodiment, the forming of the wordline-driver transistors occurs before the forming of the conductively-doped epitaxial semiconductor material of the sense-line-amplifier transistors (e.g., as shown in FIGS. 50-73).

Example embodiments of method aspects in accordance with the invention are described with reference to FIGS. 14-73, and in groups of three figures that show cross-sectional views corresponding in positions to those of FIGS. 3, 7, and 11, respectively, in a single group of three figures. Like numerals from the above-described embodiments have been used for predecessor constructions, with differences/additions using different numerals.

Figure 16:
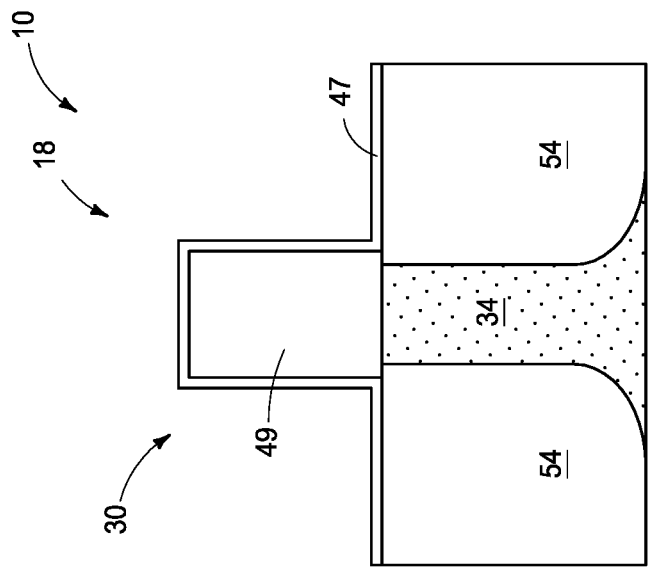
Figure 15:
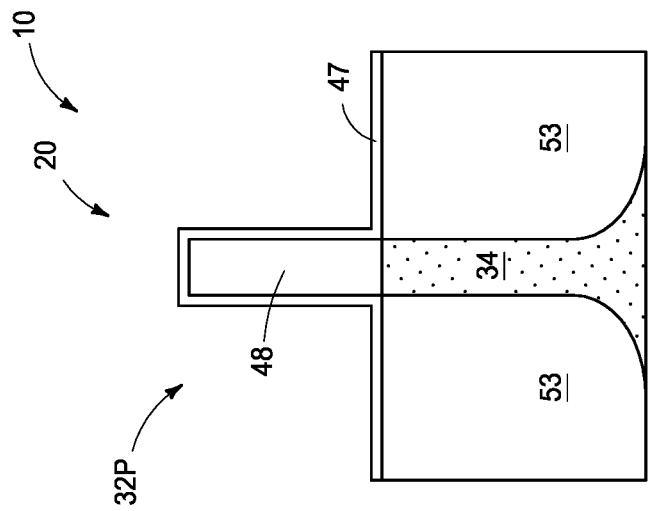
Figure 14:
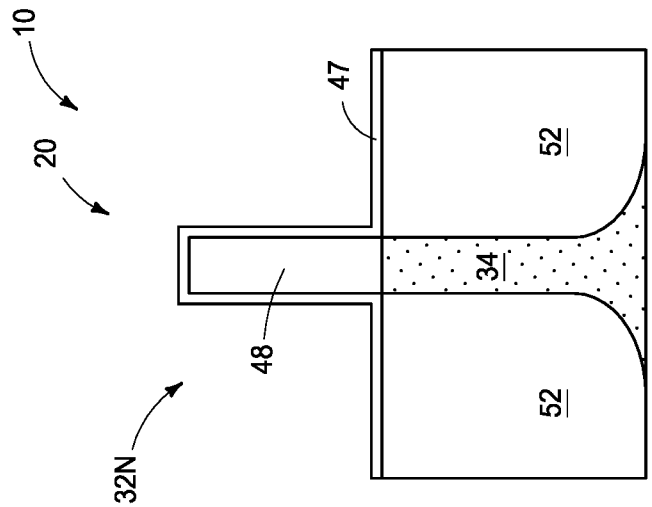

Referring to FIGS. 14-16, first masking blocks 48 have been formed that individually are directly above the at least one fin 34 of sense-line-amplifier transistors 32* being formed (e.g., NMOS transistors 32N and PMOS transistors 32P being formed). Second masking blocks 49 have been formed that individually are directly above the at least one fin 34 of wordline-driver transistors 30 being formed. Example materials for masking blocks 48, 49 include silicon nitride atop polysilicon. An example protective layer 47 (e.g., silicon nitride or material other than silicon nitride, or polysilicon) has been formed over masking blocks 48, 49. Example LDD and/or halo implants 52, 53, and 54 have been formed as shown. Such may be separately formed by masking others of the construction as shown in two of FIGS. 14-16 while implanting into one.

Referring to FIGS. 17-19, first sidewall spacers 50 (e.g., silicon nitride) have been formed over two laterally-opposing sides 51 of first masking blocks 48 and second masking blocks 49.

The example described processing proceeds with some separate processing associated with the NMOS and PMOS transistors being formed, with such example processing occurring with respect to the PMOS transistors first in one ideal embodiment, although the processing order with respect to PMOS and NMOS may be reversed. Further, the described processing with respect to FIGS. 14-49 in one ideal embodiment forms the respective conductively-doped epitaxial semiconductor materials of the NMOS and PMOS transistors to be essentially vertically recessed (relative to an uppermost surface of the at least one fin of the finFET being formed) whereas the conductively-doped epitaxial semiconductor material for the wordline-driver transistors is essentially or largely not so vertically recessed. However, any of the described conductively-doped epitaxial semiconductor materials may be formed in manners which are vertically recessed or not vertically recessed relative to an uppermost surface of the at least one fin of the finFET being formed.

Figure 22:
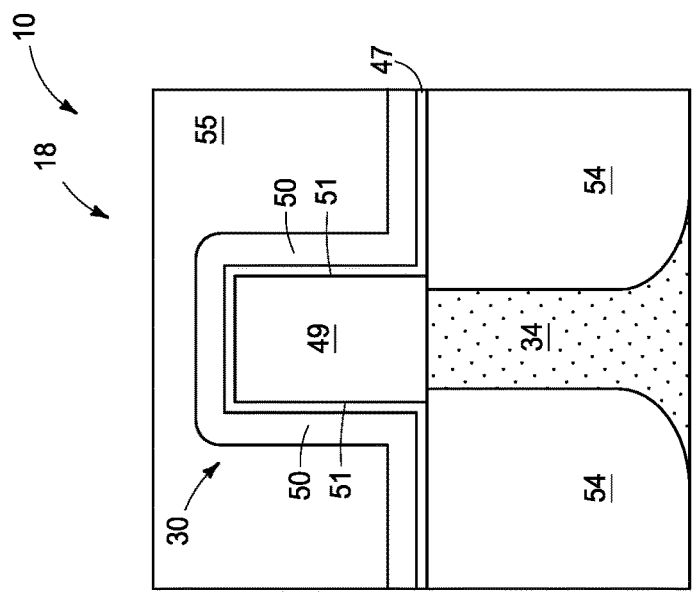
Figure 21:
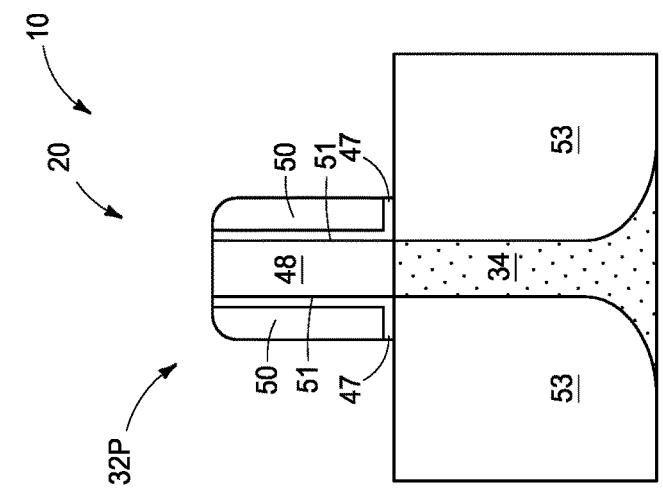
Figure 20:
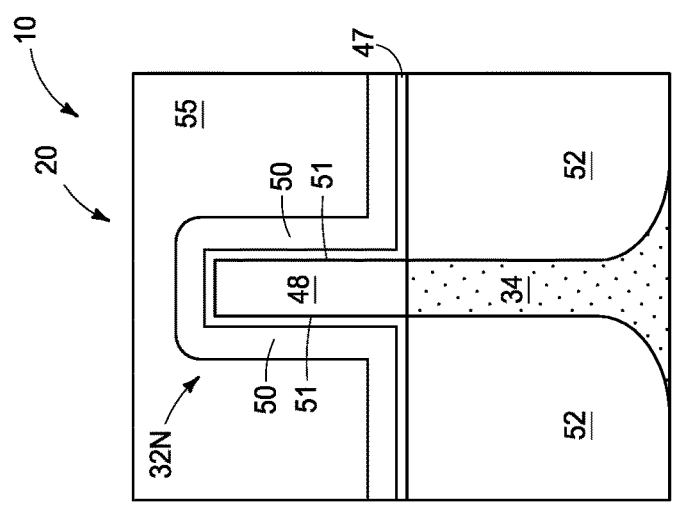
Figure 25:
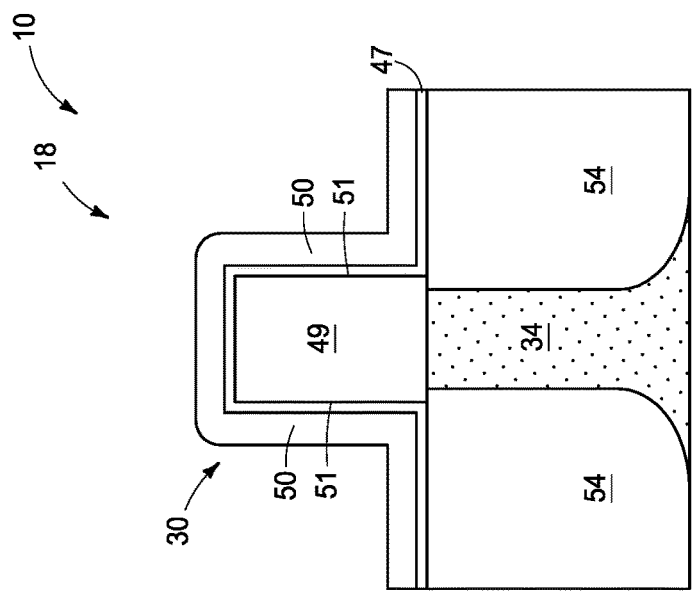
Figure 24:
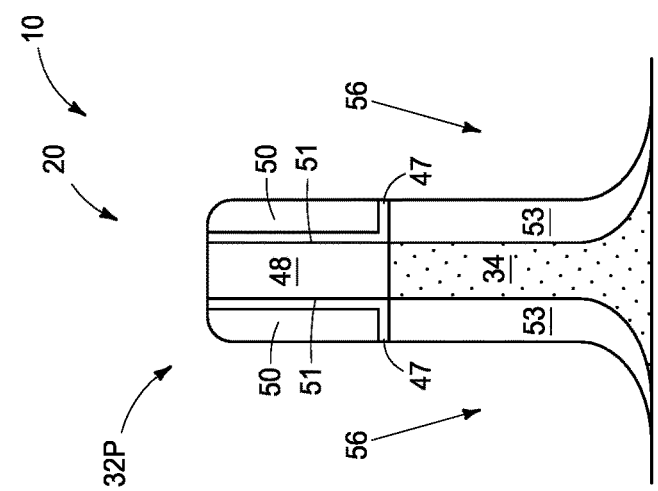
Figure 23:
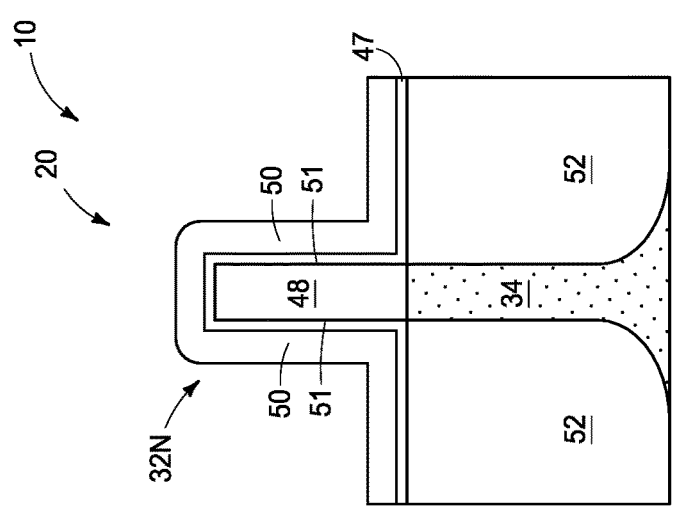

Referring to FIGS. 20-22, the construction of FIGS. 17 and 19 has been masked with masking material 55 (e.g., photoresist) while the construction of FIG. 18 remains unmasked and material of first sidewalls spacers 50 and protective material 47 have been anisotropically etched as shown.

Conductively-doped epitaxial semiconductor material of the source/drain regions of at least some of the sense-line-amplifier transistors being formed are formed laterally outward of the first masking blocks and the first sidewall spacers there-aside. For example, and in one embodiment referring to FIGS. 23-25, masking material 55 (not shown) has been removed and first masking blocks 48 and first sidewall spacers 50 there-aside (and material 47 when present) have been used as a mask while etching two recesses 56 into substrate material 53 (e.g., halo-implanted material 53) that is laterally adjacent the at least one fin 34 of sense-line-amplifier transistors 32P (in this example).

Figures 26, 27, 28:
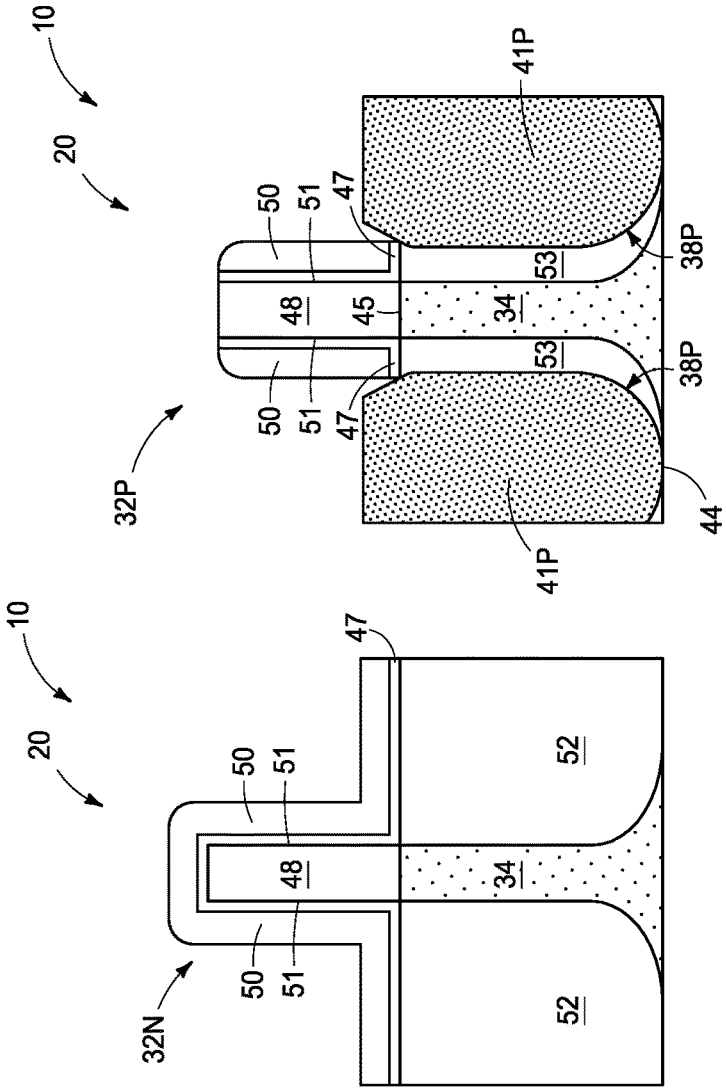
Figure 37:
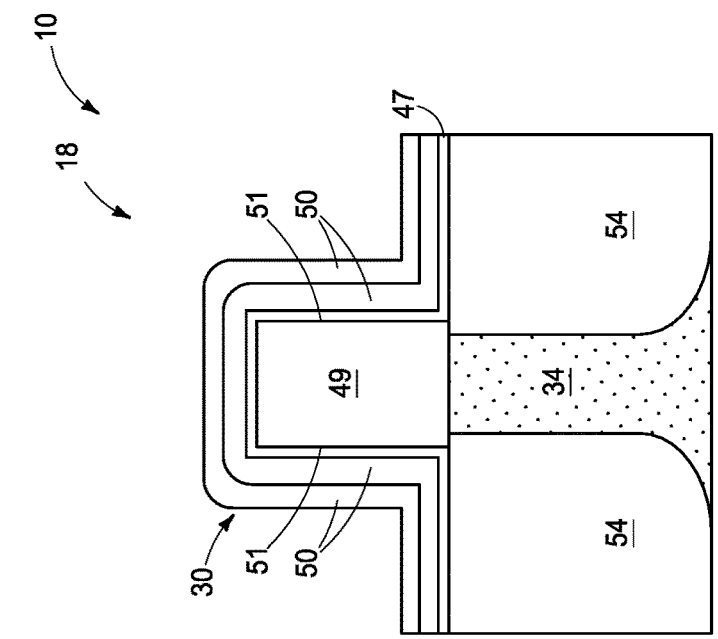
Figure 36:
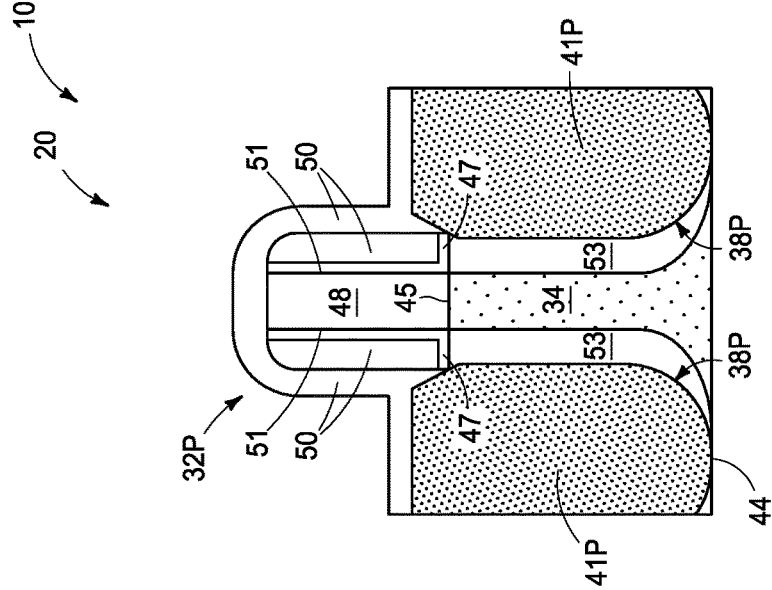
Figure 35:
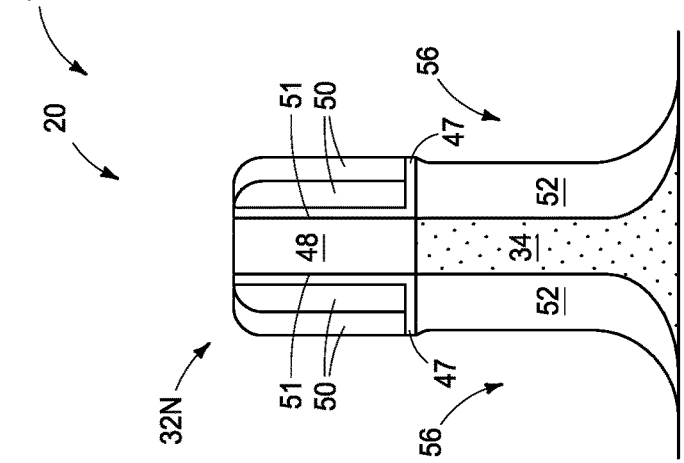
Figure 40:
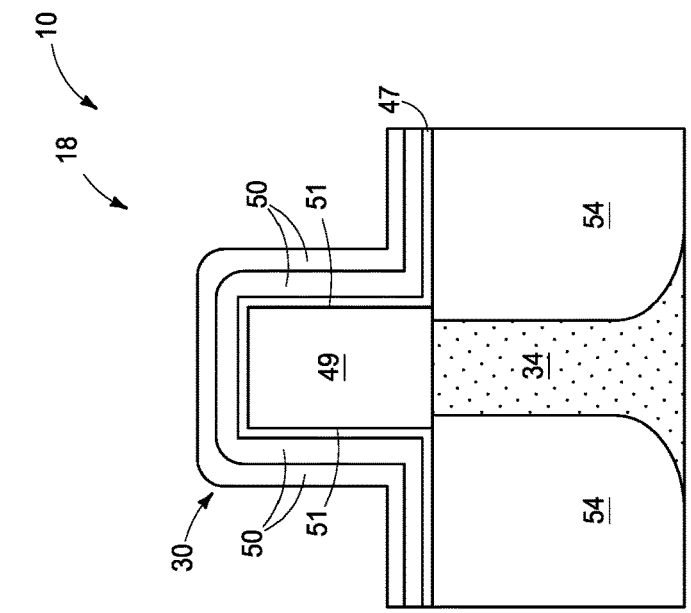
Figure 39:
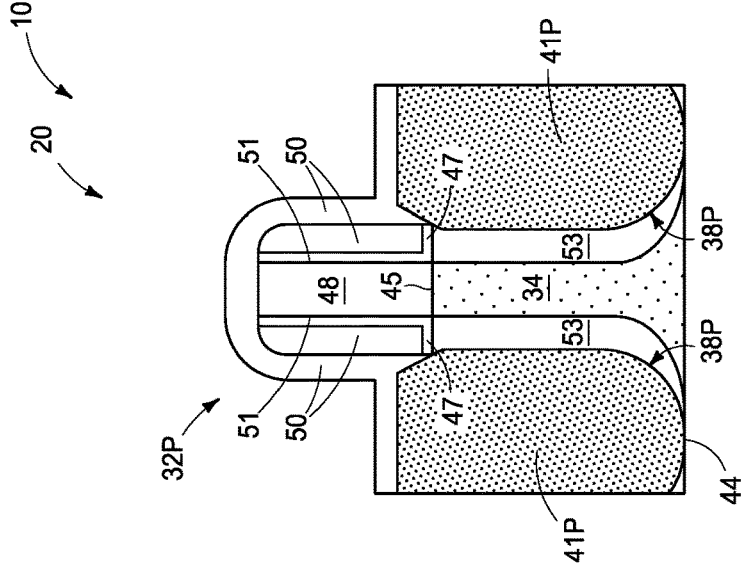
Figure 38:
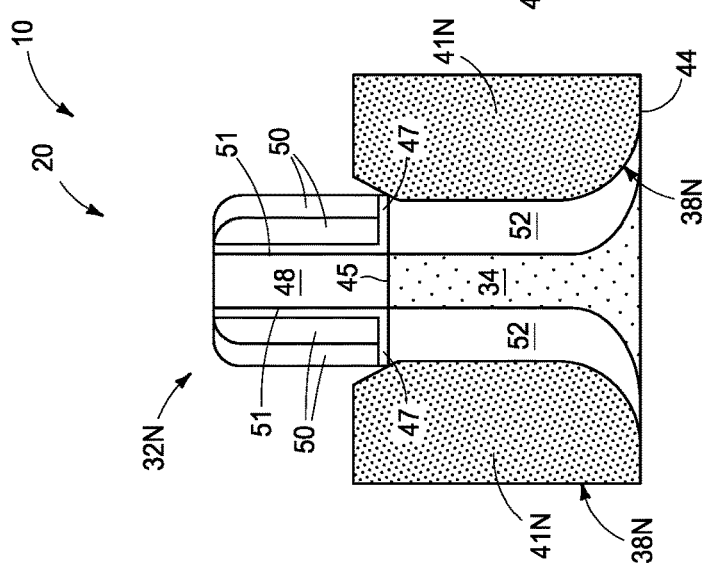

Referring to FIGS. 26-28, conductively-doped epitaxial semiconductor material 41P of source/drain regions 38P of sense-line-amplifier transistors 32P has been epitaxially grown from recesses 56 (e.g., from monocrystalline material that defines sides and bottoms of recesses 56) to have a lowest/bottom-most surface 44 that is lower than uppermost surface 45 of the least one fin 34.

FIGS. 29-40, by way of example, show analogous processing per the above-described processing in forming additive first sidewall spacers 50 in forming n-type conductively-doped epitaxial semiconductor material 41N for NMOS sense-line-amplifier transistors 32N to have a lowest surface 44 that is lower than uppermost surface 45 of the at least one fin 34.

Figure 43:
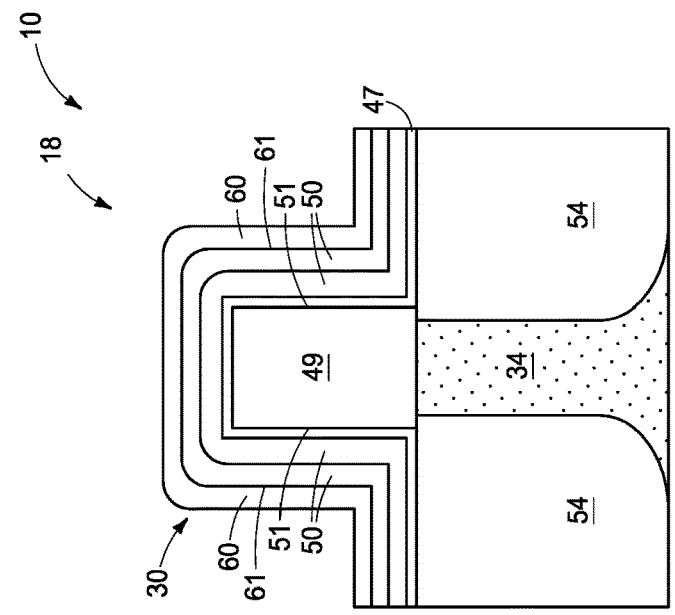
Figure 42:
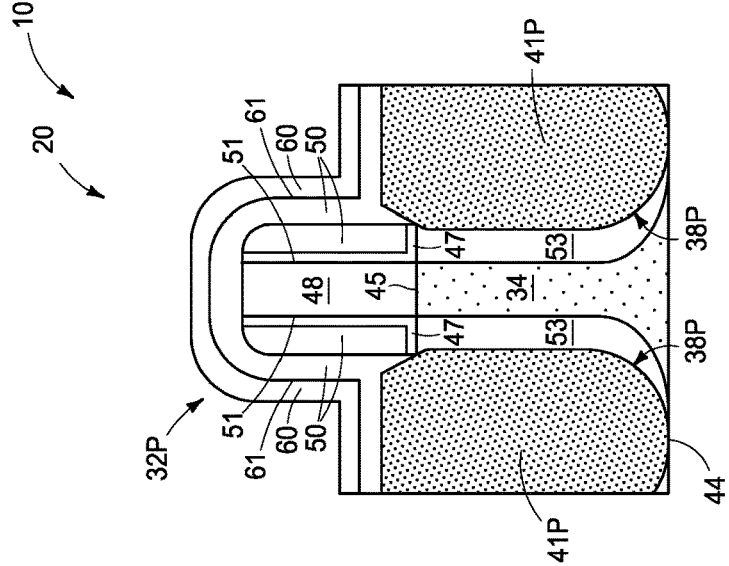
Figure 41:
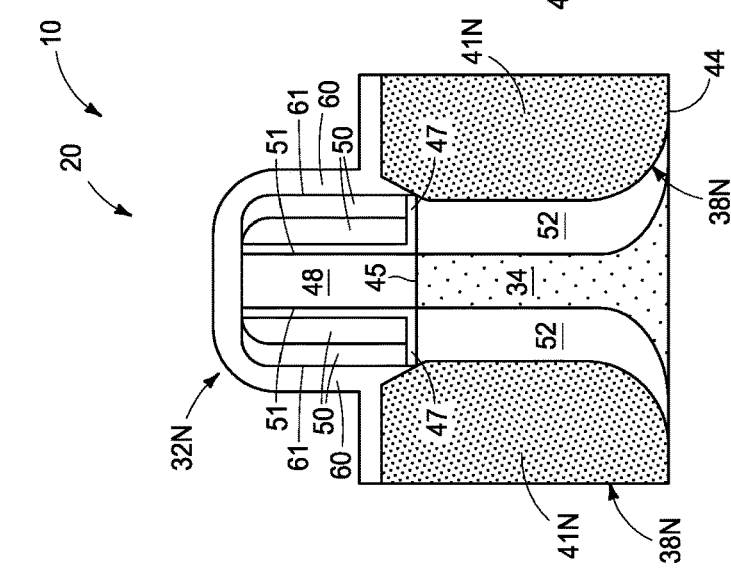
Figure 58:
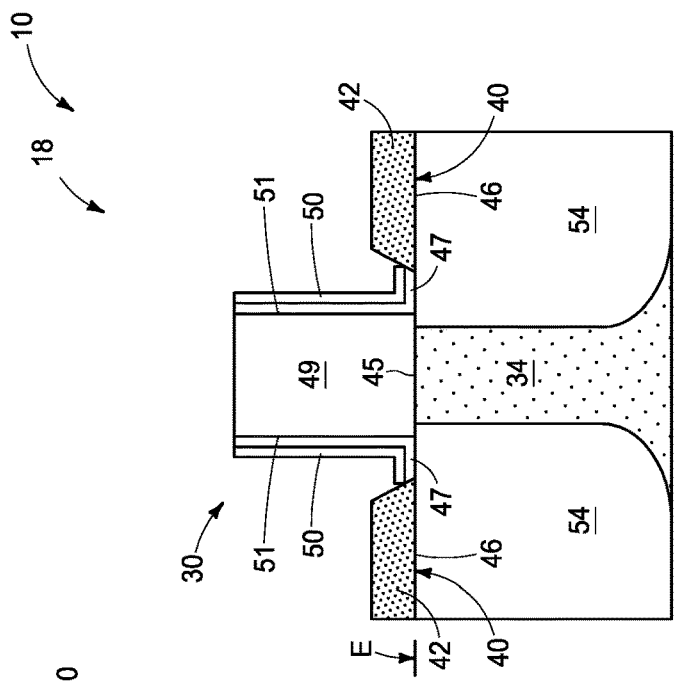
Figure 57:
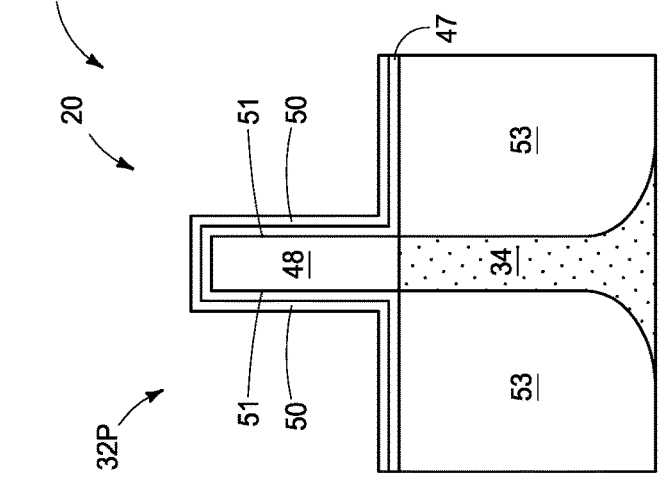
Figure 56:
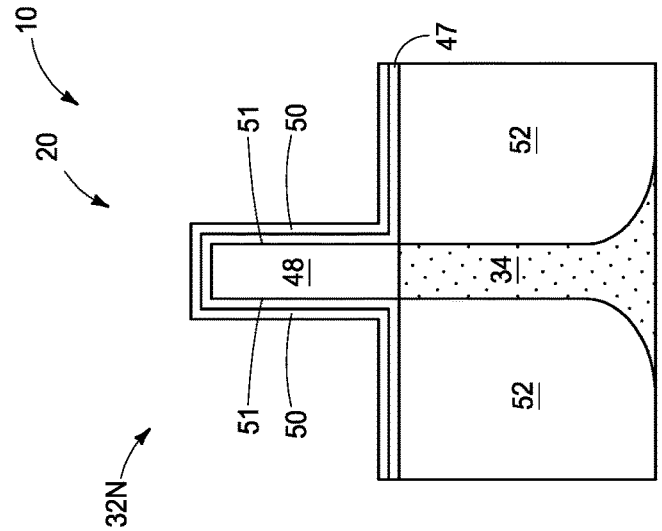
Figure 64:
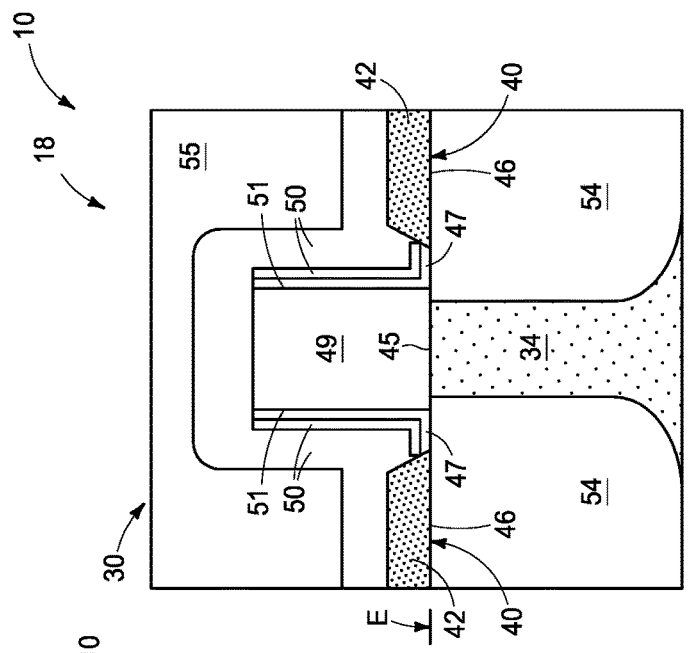
Figure 63:
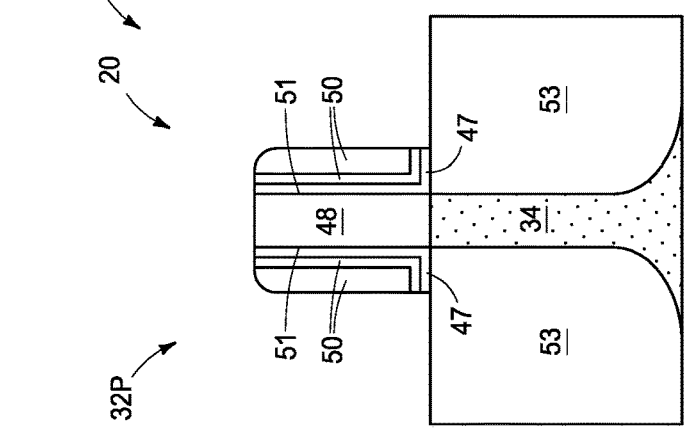
Figure 62:
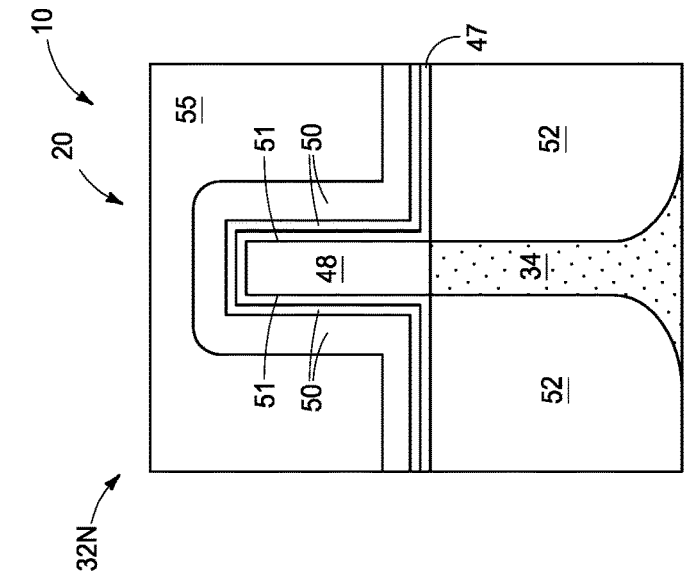
Figure 67:
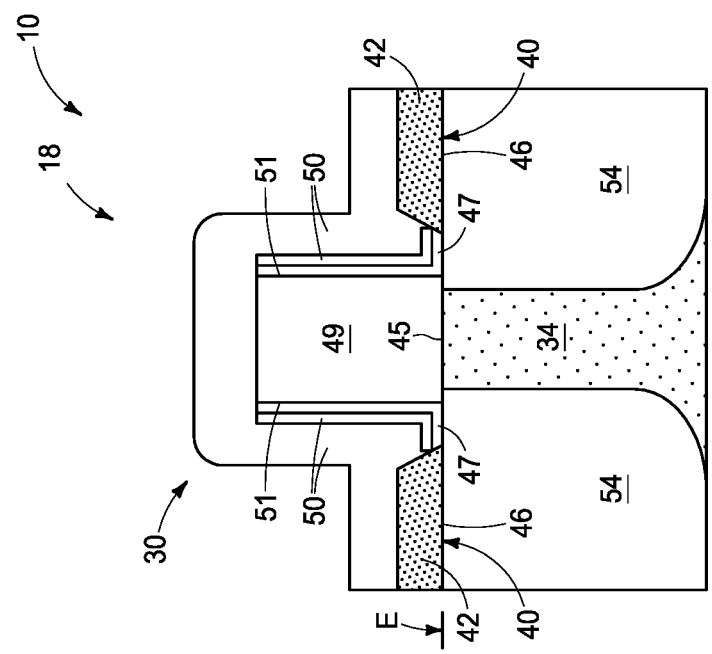
Figure 66:
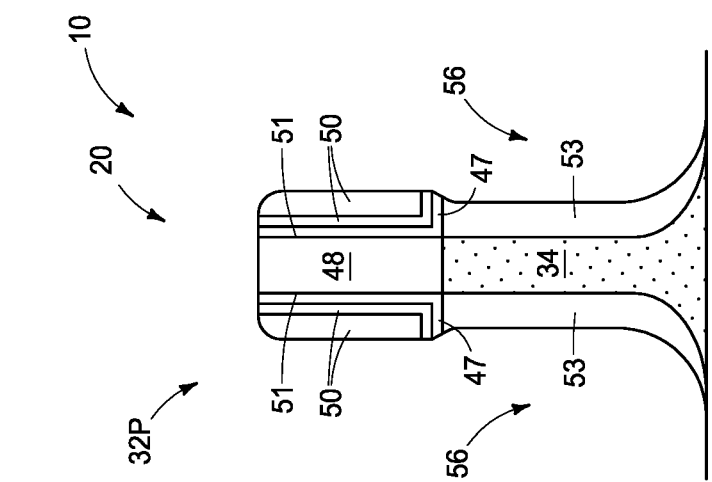
Figure 65:
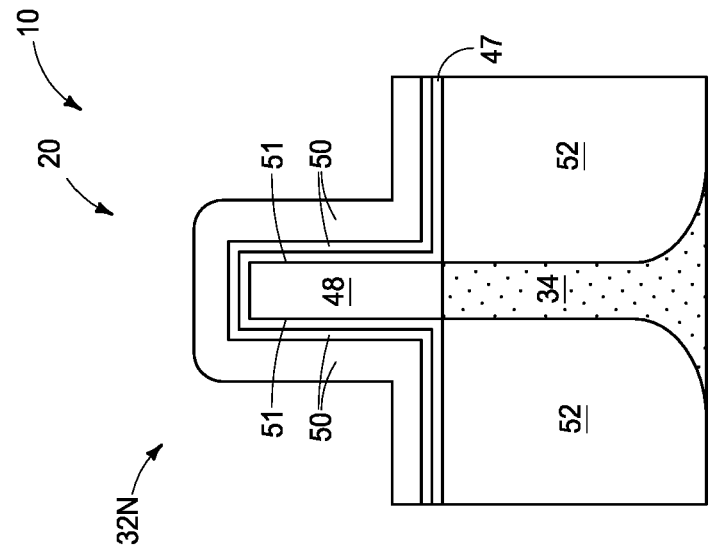

Referring to FIGS. 41-43, second sidewall spacers 60 (e.g., silicon nitride) have been formed over two laterally-opposing sides 61 of first sidewall spacers 50 that are laterally over each of first masking blocks 48 and second masking blocks 49.

Conductively-doped epitaxial semiconductor material of the source/drain regions of at least some of the wordline-driver transistors is formed laterally outward of the second masking blocks and the second sidewall spacers there-aside. For example, and referring initially to FIGS. 44-46 and in one embodiment, the constructions of FIGS. 41/44 and 42/45 have been masked (e.g., with photoresist 55) while second sidewall spacers 60 (and remnant additive first masking block material vertically there-under, etc.) have been anisotropically etched.

Referring to FIG. 47-49, second masking blocks 49 with first and second sidewall spacers 50, 60 there-aside have been used as a mask while epitaxially growing conductively-doped epitaxial semiconductor material 42 of source/drain regions 40 of wordline-driver transistors 30 from uppermost surface 45 of at least one fin 34 to have a lower surface 46 that is at the same elevation as uppermost surface 45 of the at least one fin 34.

Conductive doping of the above-described conductively-doped epitaxial semiconductor materials 41*, 42 may occur in silt while being epitaxially grown and/or subsequently, and otherwise optimized as will be appreciated by the artisan. Masking blocks 48, 49 (and some, all, or none of materials there-aside) may be subsequently removed and conductive gate material substituted therefor (plus gate insulator 25, 27), for example in a damascene-like manner or by a manner involving deposition of conductive gate material followed by subtractive etching/patterning thereof.

Any other attribute(s) or aspect(s) as shown and/or described herein with respect to other embodiments may be used.

FIGS. 50-73 show essentially self-explanatory processing analogous/corresponding to that described above wherein, in one example, the forming of the wordline-driver transistors occurs before the forming of the conductively-doped epitaxial semiconductor material of the sense-line-amplifier transistors. Such includes sequentially steps such as forming first masking blocks that individually are directly above the at least one fin of the sense-line-amplifier transistors and second masking blocks that individually are directly above the at least one fin of the wordline-driver transistors being formed. Sidewall spacers are formed over two laterally-opposing sides of the first and second masking blocks. At least some material of the sidewall spacers is removed (e.g., by etching) from individual of the second masking blocks. The conductively-doped epitaxial semiconductor material of the source/drain regions of the wordline-driver transistors is formed laterally outward of the second masking blocks. More sidewall spacers are formed over the first and second masking blocks. The conductively-doped epitaxial semiconductor material of the source/drain regions of the sense-line-amplifier transistors is formed laterally outward of the first masking blocks and the more sidewall spacers there-aside. In one embodiment, the at least one fin of the sense-line-amplifier transistors and the wordline-driver transistors are formed at the same time. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components).

Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, DRAM circuitry comprises a memory array comprising memory cells individually comprising a transistor and a charge-storage device. The transistors individually comprise two source/drain regions having a gate there-between that is part of one of multiple wordlines of the memory array. One of the source/drain regions is electrically coupled to one of the charge-storage devices. The other of the source/drain regions is electrically coupled to one of multiple sense lines of the memory array. Peripheral circuitry comprises wordline-driver transistors having gates which individually comprise one of the wordlines and comprises sense-line-amplifier transistors having gates which individually comprise one of the sense lines. The sense-line-amplifier transistors and the wordline-driver transistors individually are a finFET having at least one fin comprising a channel region of the respective finFET. The sense-line-amplifier transistors and the wordline-driver transistors individually comprise two source/drain regions that individually comprise conductively-doped epitaxial semiconductor material that is adjacent one of two laterally-opposing sides of the at least one fin in a vertical cross-section.

In some embodiments, DRAM circuitry comprises a memory array comprising memory cells individually comprising a transistor and a charge-storage device. The transistors individually comprise two source/drain regions having a gate there-between that is part of one of multiple wordlines of the memory array. One of the source/drain regions is electrically coupled to one of the charge-storage devices. The other of the source/drain regions is electrically coupled to one of multiple sense lines of the memory array. Peripheral circuitry comprises wordline-driver transistors having gates which individually comprise one of the wordlines and comprise sense-line-amplifier transistors having gates which individually comprise one of the sense lines. The sense-line-amplifier transistors and the wordline-driver transistors individually are a finFET having at least one fin comprising a channel region of the respective finFET. The sense-line-amplifier transistors and the wordline-driver transistors individually comprise two source/drain regions that individually comprise conductively-doped epitaxial semiconductor material that is adjacent one of two laterally-opposing sides of the at least one fin in a vertical cross-section. The conductively-doped epitaxial semiconductor material of the source/drain regions of the sense-line-amplifier transistors has a bottom-most surface that is lower than an uppermost surface of the at least one fin. The conductively-doped epitaxial semiconductor material of the source/drain regions of the wordline-driver transistors has a lower surface that is at the same elevation as the uppermost surface of the at least one fin. Gate insulator is between the at least one fin and the gates of the sense-line-amplifier transistors and the wordline-driver transistors. The gate insulator that is between the at least one fin and the gates of the sense-line-amplifier transistors and the gate insulator that is between the at least one fin and the gates of the wordline-driver transistors are of the same composition relative one another. The gate insulator that is between the at least one fin and the gates of the sense-line-amplifier transistors is thinner than the gate insulator that is between the at least one fin and the gates of the wordline-driver transistors.

In some embodiments, a method of forming DRAM circuitry comprises forming a memory array comprising memory cells individually comprising a transistor and a charge-storage device. The transistors individually comprise two source/drain regions having a gate there-between that is part of one of multiple wordlines of the memory array. One of the source/drain regions is electrically coupled to one of the charge-storage devices. The other of the source/drain regions is electrically coupled to one of multiple sense lines of the memory array. Peripheral circuitry is formed that comprises wordline-driver transistors having gates which individually comprise one of the wordlines and comprises sense-line-amplifier transistors having gates which individually comprise one of the sense lines. The sense-line-amplifier transistors and the wordline-driver transistors are formed individually to be a finFET having at least one fin comprising a channel region of the respective finFET. The sense-line-amplifier transistors and the wordline-driver transistors are formed individually to comprise two source/drain regions that individually comprise conductively-doped epitaxial semiconductor material that is adjacent one of two laterally-opposing sides of the at least one fin in a vertical cross-section. The forming of the conductively-doped epitaxial semiconductor material of the sense-line-amplifier transistors occurs before the forming of the conductively-doped epitaxial semiconductor material of the wordline-driver transistors.

In some embodiments, a method of forming DRAM circuitry comprises forming a memory array comprising memory cells individually comprising a transistor and a charge-storage device. The transistors individually comprise two source/drain regions having a gate there-between that is part of one of multiple wordlines of the memory array. One of the source/drain regions is electrically coupled to one of the charge-storage devices. The other of the source/drain regions is electrically coupled to one of multiple sense lines of the memory array. Peripheral circuitry is formed that comprises wordline-driver transistors having gates which individually comprise one of the wordlines and comprises sense-line-amplifier transistors having gates which individually comprise one of the sense lines. The sense-line-amplifier transistors and the wordline-driver transistors are formed individually to be a finFET having at least one fin comprising a channel region of the respective finFET. The sense-line-amplifier transistors and the wordline-driver transistors are formed individually to comprise two source/drain regions that individually comprise conductively-doped epitaxial semiconductor material that is adjacent one of two laterally-opposing sides of the at least one fin in a vertical cross-section. The forming of the wordline-driver transistors occurs before the forming of the conductively-doped epitaxial semiconductor material of the sense-line-amplifier transistors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. DRAM circuitry comprising:
   a memory array comprising memory cells individually comprising a transistor and a charge-storage device, the transistors individually comprising two source/drain regions having a gate there-between that is part of one of multiple wordlines of the memory array, one of the source/drain regions being electrically coupled to one of the charge-storage devices, the other of the source/drain regions being electrically coupled to one of multiple sense lines of the memory array;
   peripheral circuitry comprising wordline-driver transistors having gates which individually comprise one of the wordlines and comprising sense-line-amplifier transistors having gates which individually comprise one of the sense lines;
   the sense-line-amplifier transistors and the wordline-driver transistors individually being a finFET having at least one fin comprising a channel region of the respective finFET, the sense-line-amplifier transistors and the wordline-driver transistors individually comprising two source/drain regions that individually comprise conductively-doped epitaxial semiconductor material that is adjacent one of two laterally-opposing sides of the at least one fin in a vertical cross-section; and
   the finFETs of the sense-line-amplifer transistors and the finFETs of the wordline-driver transistors individually have two and only two channel-region fins along a vertical line through the individual finFET gate and that bisects channel length of the individual finFET.

2. The DRAM circuitry of claim 1 wherein the conductively-doped epitaxial semiconductor material of the source/drain regions of the sense-line-amplifier transistors have a bottom-most surface that is lower than an uppermost surface of the at least one fin.

3. DRAM circuitry comprising:
   a memory array comprising memory cells individually comprising a transistor and a charge-storage device, the transistors individually comprising two source/drain regions having a gate there-between that is part of one of multiple wordlines of the memory array, one of the source/drain regions being electrically coupled to one of the charge-storage devices, the other of the source/drain regions being electrically coupled to one of multiple sense lines of the memory array;
   peripheral circuitry comprising wordline-driver transistors having gates which individually comprise one of the wordlines and comprising sense-line-amplifier transistors having gates which individually comprise one of the sense lines;
   the sense-line-amplifier transistors and the wordline-driver transistors individually being a finFET having at least one fin comprising a channel region of the respective finFET, the sense-line-amplifier transistors and the wordline-driver transistors individually comprising two source/drain regions that individually comprise conductively-doped epitaxial semiconductor material that is adjacent one of two laterally-opposing sides of the at least one fin in a vertical cross-section; and
   the sense-line-amplifier transistors collectively comprise NMOS transistors and PMOS transistors.

4. The DRAM circuitry of claim 3 wherein the source/drain regions of the sense-line-amplifier transistors that comprise conductively-doped epitaxial semiconductor material of the NMOS transistors individually comprise silicon that is conductively-doped with phosphorus.

5. The DRAM circuitry of claim 3 wherein the source/drain regions of the sense-line-amplifier transistors that comprise conductively-doped epitaxial semiconductor material of the PMOS transistors individually comprise a mixture of silicon and germanium that is conductively-doped with boron.

6. DRAM circuitry comprising:
   a memory array comprising memory cells individually comprising a transistor and a charge-storage device, the transistors individually comprising two source/drain regions having a gate there-between that is part of one of multiple wordlines of the memory array, one of the source/drain regions being electrically coupled to one of the charge-storage devices, the other of the source/drain regions being electrically coupled to one of multiple sense lines of the memory array;
   peripheral circuitry comprising wordline-driver transistors having gates which individually comprise one of the wordlines and comprising sense-line-amplifier transistors having gates which individually comprise one of the sense lines;
   the sense-line-amplifier transistors and the wordline-driver transistors individually being a finFET having at least one fin comprising a channel region of the respective finFET, the sense-line-amplifier transistors and the wordline-driver transistors individually comprising two source/drain regions that individually comprise conductively-doped epitaxial semiconductor material that is adjacent one of two laterally-opposing sides of the at least one fin in a vertical cross-section; and
   the conductively-doped epitaxial semiconductor material of the source/drain regions of the wordline-driver transistors have a lower surface that is at the same elevation as an uppermost surface of the at least one fin.

7. The DRAM circuitry of claim 6 wherein the conductively-doped epitaxial semiconductor material of the source/drain regions of the sense-line-amplifier transistors have a bottom-most surface that is lower than the uppermost surface of the at least one fin.

8. DRAM circuitry comprising:
   a memory array comprising memory cells individually comprising a transistor and a charge-storage device, the transistors individually comprising two source/drain regions having a gate there-between that is part of one of multiple wordlines of the memory array, one of the source/drain regions being electrically coupled to one of the charge-storage devices, the other of the source/drain regions being electrically coupled to one of multiple sense lines of the memory array;
   peripheral circuitry comprising wordline-driver transistors having gates which individually comprise one of the wordlines and comprising sense-line-amplifier transistors having gates which individually comprise one of the sense lines;

the sense-line-amplifier transistors and the wordline-driver transistors individually being a finFET having at least one fin comprising a channel region of the respective finFET, the sense-line-amplifier transistors and the wordline-driver transistors individually comprising two source/drain regions that individually comprise conductively-doped epitaxial semiconductor material that is adjacent one of two laterally-opposing sides of the at least one fin in a vertical cross-section; and comprising gate insulator between the at least one fin and the gates of the sense-line-amplifier transistors and the wordline-driver transistors, the gate insulator that is between the at least one fin and the gates of the sense-line-amplifier transistors being thinner than the gate insulator that is between the at least one fin and the gates of the wordline-driver transistors.

9. The DRAM circuitry of claim 8 wherein the sense-line-amplifier transistors collectively comprise NMOS transistors and PMOS transistors.

10. The DRAM circuitry of claim 8 wherein the gate insulator that is between the at least one fin and the gates of the sense-line-amplifier transistors and the gate insulator that is between the at least one fin and the gates of the wordline-driver transistors are of the same composition relative one another.

11. The DRAM circuitry of claim 10 wherein the same composition is silicon dioxide.

12. The DRAM circuitry of claim 10 wherein the gate insulator that is between the at least one fin and the gates of the sense-line-amplifier transistors has thickness of 5 Angstroms to 30 Angstroms and the gate insulator that is between the at least one fin and the gates of the wordline-driver transistors has thickness of 30 Angstroms to 60 Angstroms.

13. DRAM circuitry comprising:
  a memory array comprising memory cells individually comprising a transistor and a charge-storage device, the transistors individually comprising two source/drain regions having a gate there-between that is part of one of multiple wordlines of the memory array, one of the source/drain regions being electrically coupled to one of the charge-storage devices, the other of the source/drain regions being electrically coupled to one of multiple sense lines of the memory array;
  peripheral circuitry comprising wordline-driver transistors having gates which individually comprise one of the wordlines and comprising sense-line-amplifier transistors having gates which individually comprise one of the sense lines;
  the sense-line-amplifier transistors and the wordline-driver transistors individually being a finFET having at least one fin comprising a channel region of the respective finFET, the sense-line-amplifier transistors and the wordline-driver transistors individually comprising two source/drain regions that individually comprise conductively-doped epitaxial semiconductor material that is adjacent one of two laterally-opposing sides of the at least one fin in a vertical cross-section;
  the conductively-doped epitaxial semiconductor material of the source/drain regions of the sense-line-amplifier transistors having a bottom-most surface that is lower than an uppermost surface of the at least one fin;
  the conductively-doped epitaxial semiconductor material of the source/drain regions of the wordline-driver transistors having a lower surface that is at the same elevation as the uppermost surface of the at least one fin;
  gate insulator between the at least one fin and the gates of the sense-line-amplifier transistors and the wordline-driver transistors, the gate insulator that is between the at least one fin and the gates of the sense-line-amplifier transistors and the gate insulator that is between the at least one fin and the gates of the wordline-driver transistors being of the same composition relative one another, the gate insulator that is between the at least one fin and the gates of the sense-line-amplifier transistors being thinner than the gate insulator that is between the at least one fin and the gates of the wordline-driver transistors.

14. The DRAM circuitry of claim 13 wherein the same composition is silicon dioxide.

15. The DRAM circuitry of claim 13 wherein the gate insulator that is between the at least one fin and the gates of the sense-line-amplifier transistors has thickness of 5 Angstroms to 30 Angstroms and the gate insulator that is between the at least one fin and the gates of the wordline-driver transistors has thickness of 30 Angstroms to 60 Angstroms.

16. The DRAM circuitry of claim 13 wherein the sense-line-amplifier transistors collectively comprise NMOS transistors and PMOS transistors.

17. The DRAM circuitry of claim 16 wherein,
  the source/drain regions of the sense-line-amplifier transistors that comprise conductively-doped epitaxial semiconductor material of the NMOS transistors individually comprise silicon that is conductively-doped with phosphorus; and
  the source/drain regions of the sense-line-amplifier transistors that comprise conductively-doped epitaxial semiconductor material of the PMOS transistors individually comprise a mixture of silicon and germanium that is conductively-doped with boron.

* * * * *